United States Patent [19]
Arimoto

[11] Patent Number: 5,315,166
[45] Date of Patent: May 24, 1994

[54] SUBSTRATE VOLTAGE GENERATOR AND METHOD THEREFOR IN A SEMICONDUCTOR DEVICE HAVING SELECTIVELY ACTIVATED INTERNAL STEPPED-DOWN POWER SUPPLY VOLTAGES

[75] Inventor: Kazutami Arimoto, Hyogo, Japan

[73] Assignee: Mitsubishi Denki Kabushiki Kaisha, Tokyo, Japan

[21] Appl. No.: 53,532

[22] Filed: Apr. 28, 1993

Related U.S. Application Data

[63] Continuation of Ser. No. 974,840, Nov. 16, 1992, Pat. No. 5,280,197, which is a continuation of Ser. No. 617,728, Nov. 26, 1990, abandoned.

[30] Foreign Application Priority Data

Apr. 6, 1990 [JP] Japan ................................ 2-92546

[51] Int. Cl.$^5$ .............................................. H03K 3/01
[52] U.S. Cl. .............................. 307/296.2; 307/296.1; 307/362; 307/363; 307/296.8
[58] Field of Search ............... 307/296.1, 296.2, 296.8, 307/296.5, 443, 362, 363

[56] References Cited

U.S. PATENT DOCUMENTS

| | | | |
|---|---|---|---|
| 4,401,897 | 8/1983 | Martino, Jr. et al. | 307/297 |
| 4,691,304 | 9/1987 | Hori et al. | 365/226 |
| 4,825,018 | 4/1989 | Okada et al. | 323/351 |
| 4,922,133 | 5/1990 | Iwahashi et al. | 307/363 |
| 5,034,625 | 7/1991 | Min et al. | 307/296.2 |

FOREIGN PATENT DOCUMENTS

| | | |
|---|---|---|
| 0063483 | 10/1982 | European Pat. Off. |
| 8714849UI | 2/1988 | Fed. Rep. of Germany |
| 60-25309 | 2/1985 | Japan |
| 60-85495 | 5/1985 | Japan |
| 62-36797 | 2/1987 | Japan |
| 63-306594 | 12/1988 | Japan |

OTHER PUBLICATIONS

"A New On-Chip Voltage Converter for Submicrometer High-Density DRAM's", Furuyama, IEEE Journal of Solid-State Circuits, vol. SC-22, No. 3, Jun. 1987.

"A 20ns Static Column 1Mb DRAM in CMOS Technology", Sato et al., 1986 IEEE International Solid-State Circuits Conference, pp. 254-255.

Primary Examiner—Robert J. Pascal
Assistant Examiner—Reginald A. Ratliff
Attorney, Agent, or Firm—Lowe, Price, LeBlanc & Becker

[57] ABSTRACT

A semiconductor device having an internal voltage down converter includes a circuit operating with an externally applied power supply voltage, a circuit operating with an external stepped-down voltage as an operation power supply voltage, and substrate voltage generators for generating a substrate potential, or a substrate bias voltage according to a state of the internal stepped-down voltage. The first substrate voltage generator includes a first generating circuit operating with the externally applied power supply voltage, a second generating circuit operating with the internal stepped-down voltage, and a circuit for operating the first generating circuit in a period from turn-on of the external power supply until the internal stepped-down voltage becomes stable, and for operating the second generating circuit thereafter. The second substrate voltage generator includes first and second generating circuits, and a circuit responsive to the substrate voltage for selectively activating the first and second generating circuits. Those constructions make it possible to stably apply a substrate voltage corresponding to an operation voltage to the substrate region.

9 Claims, 9 Drawing Sheets

SUBSTRATE VOLTAGE GENERATOR AND METHOD THEREFOR IN A SEMICONDUCTOR DEVICE HAVING SELECTIVELY ACTIVATED INTERNAL STEPPED-DOWN POWER SUPPLY VOLTAGES

This application is a continuation of application Ser. No. 07/974,840 now U.S. Pat. No. 5,280,197 filed Nov. 16, 1992 which is a continuation of application Ser. No. 07/617,728 filed Nov. 26, 1990 now abandoned.

BACKGROUND OF THE INVENTION

1. Field of the Invention

The present invention relates to a substrate voltage generator for applying a prescribed bias voltage to a semiconductor substrate and particularly to a substrate voltage generator and a method therefor in a semiconductor device having an internal voltage down converter for lowering an external power supply voltage, thereby generating an internal stepped-down power supply voltage.

2. Description of the Background Art

Recently, 4 M (mega) bit static random access memories (SRAMs) and 16 M (mega) bit dynamic random access memories (RAMs) utilizing micro-lithography of 0.5 μm level have been developed and made public. It is pointed out that if a short channel MOS (insulated gate field effect) transistor of a gate length of less than 0.6 μm is operated by a power supply voltage 5 V in the same manner as in a MOS transistor of a gate length of about 1 μm to 0.8 μm used in a 4 M bit DRAM or the like, transistor characteristics are deteriorated considerably due to time dependent dielectric breakdown of a gate insulating film or the like, causing reliability to be lowered.

In order to use a short channel MOS transistor having a gate length of 0.5 μm not causing such deterioration of transistor characteristics, it may be considered to change the power supply voltage from 5 V to 3.3 V for example. However, in view of adaptability to the 5 V power supply system widely used conventionally, a problem is involved in the change of the power supply voltage. Therefore, there has been proposed a system of operating an internal circuit of a semiconductor memory device by a stepped-down voltage of e.g. 3.3 V while maintaining the external power supply voltage at 5 V as in the prior art.

FIG. 1 is a functional block diagram of a conventional semiconductor device having an internal voltage down converter. Referring to FIG. 1, the semiconductor device includes a function circuit 101 formed by a memory for example for performing a prescribed function, and an input/output circuit 102 for transfer of data between the function circuit 101 and an external unit. The semiconductor device further includes an internal voltage down converter 103 for lowering an externally applied power supply voltage Vocc and generating a prescribed internal power supply voltage Vicc, and a substrate voltage generator ($V_{BB}$ generator) 104 responsive to the external power supply voltage Vocc for generating a prescribed bias voltage and applying the same to a semiconductor substrate 100.

The semiconductor device shown in FIG. 1 contains the internal voltage down converter 103 integrated on the semiconductor substrate 100, and the external power supply voltage Vocc is converted to be stepped down by the internal voltage down converter 103, whereby the prescribed internal power supply voltage Vicc is generated. In some cases, the prescribed internal power supply voltage Vicc is supplied to only the function circuit 101, and in some cases, it is supplied to both the function circuit 101 and the input/output circuit 102.

FIG. 2 is a block diagram of the internal voltage down converter shown in FIG. 1, which is disclosed for example by Furuyama et al. in IEEE Journal of Solid-State Circuits, Vol. SC-22, No. 3, June, 1987, pp. 437–441. Referring to FIG. 2, the internal voltage down converter 103 includes: a reference voltage generating circuit 110 for generating a prescribed reference voltage Vref from the external power supply voltage Vocc; a differential amplifier 111 operating with the external power supply voltage Vocc as the operation power supply voltage for comparing the internal power supply voltage Vicc and the reference voltage Vref and generating a control signal (regulation signal) $\phi_x$ according to the result of the comparison; and an output circuit 112 responsive to the regulation signal $\phi_x$ from the differential amplifier 111 for receiving current from the external power supply voltage Vocc and generating the internal power supply voltage Vicc.

The differential amplifier 111 amplifies differentially the reference voltage Vref and the internal power supply voltage Vicc, thereby generating the regulation signal $\phi_x$.

FIG. 3 is a diagram showing a specific construction of the internal voltage down converter shown in FIG. 2. Referring to FIG. 3, the reference voltage generating circuit 110 includes: three p channel MOS transistors P1, P2, P3 seriesly-connected between the external power supply voltage vocc and a second power supply voltage Vss as a ground potential for example; a p channel MOS transistor P4 connected between the external power supply voltage Vocc and a node N2 and receiving a potential of a node N1 at its gate; and a p channel MOS transistor P5 connected between the node N2 and the second power supply potential (referred to simply as the ground potential) Vss. The p channel MOS transistors P1 to P3 have their gates and drains connected together to function as a resistor, so that a voltage according to the on resistance thereof is supplied to the node N1. The p channel MOS transistor P4 receives the potential of the node N1 at its gate and has a resistance value according to the gate potential, and it transmits current from the external power supply voltage Vocc to the node N2. Those p channel MOS transistors P1 to P4 constitute a constant current load with respect to the p channel MOS transistor P5. Operation of this reference voltage generating circuit will be briefly described.

Now, let us assume a case in which the external power supply voltage Vocc is increased. In this case, a large amount of current flows into a path formed by the transistors P1 to P3, whereby the potential of the node N1 increases. In response to the increase of the potential of the node N1, the gate potential of the transistor P4 increases. Thus, the resistance value of the transistor P4 increases, making it difficult for current to flow in the transistor P4.

Conversely, if the external power supply voltage Vocc is decreased, the current flowing in the path formed by the transistors P1 to P3 becomes small. Thus, the potential of the node N1 is lowered and the resistance value of the transistor P4 becomes small, whereby current can easily flows through the transistor P4. The gate potential of the transistor P4 is regulated according to change in the external power supply voltage Vocc, whereby constant current always flows into the node N2 and the constant reference voltage Vref proportional to an absolute value of threshold voltage $V_{TP}$ of the transistor P5 appears at the node N2 (in the case where a plurality of transistors P5 are provided).

The differential amplifier 111 includes: a p channel MOS transistor P10 provided between the external power supply voltage Vocc and a node N3, and receiving a clock signal $\phi c$ at its gate; a p channel MOS transistor P11 provided between the external power supply voltage Vocc and the node N3 and having its gate connected to the ground potential Vss; a p channel MOS transistor P12 provided between the node N3 and a node N4 and receiving the reference voltage Vref at its gate; a p channel MOS transistor P13 provided between the nodes N3 and N5 and receiving the internal power supply voltage Vicc at its gate; an n channel MOS transistor NT1 provided between the node N4 and the ground potential Vss and having its gate connected to the node N5; and an n channel MOS transistor NT2 provided between the node N5 and the ground potential Vss and having its gate connected to the node N5 and the gate of the transistor NT1.

The transistor P10 has a relatively large current supplying capability, while the transistor P11 has a small current supplying capability to allow a very small current to flow. The control signal $\phi c$ is set to a logical low (L) level of an activated state during a period in which the function circuit 101 (as shown in FIG. 1) of the semiconductor device operates, and it is set to a logical high (H) level of an inactivated state during a period in which the internal circuit does not operate. Thus, the transistor P10 having the large current supplying capability is in a conducting state during the operation of the internal circuit to improve the response characteristics of a current mirror type amplifier (i.e., a circuit stage formed by the transistors P12, P13, NT1 and NT2), and only the transistor P11 is in a conducting state in the period of non-operation of the internal circuit, thereby reducing consumption current. Switching between the operation and non-operation of the internal circuit is effected in the following manner. For example, if the function circuit 101 is a memory, the control signal $\phi c$ is generated in response to a signal (e.g., a signal $\overline{RAS}$) indicating whether a memory cycle is started or not.

The output circuit 112 is provided between the external power supply voltage Vocc and the internal power supply voltage line Vicc (a signal line and a signal transmitted thereon being shown by the same reference characters) and it includes a p channel MOS transistor P15 having its gate receiving the potential of the node N4 of the differential amplifier 111 as the regulation signal $\phi_x$. Next, operations of the differential amplifier 111 and the output circuit 112 will be described.

Let us now assume that the internal power supply voltage Vicc becomes larger than the reference voltage Vref.

In this case, current flowing through the transistor P12 becomes larger than the current flowing through the transistor P13. The node N5 is connected to the gates of the transistors NT1 and NT2, and the transistors NT1 and NT2 constitute a current mirror circuit. The potential of the node N5 proportions to a value of the current flowing through the transistor P13. The larger the current flowing through the transistor P13 is, the higher the potential of the node N5 is, while the smaller the current is, the lower the potential is. The values of the current flowing in the transistors NT1 and NT2 become equal and accordingly the transistor NT1 does not allow the large current to sufficiently flow in the transistor P12, causing the potential of the node N4 to rise. In response to the rise of the potential of the node N4, namely, the regulation signal $\phi_x$, the transistor T15 is brought into a shallow on state or an off state. As a result, the supply of the current from the external power supply voltage Vocc to the internal power supply voltage line Vicc is stopped or suppressed and the internal power supply voltage Vicc is lowered.

If the internal power supply voltage Vicc is smaller than the reference voltage Vref, the regulation signal $\phi_x$ is lowered oppositely to the above-mentioned case and the transistor P15 is brought into a conducting state or a deeply conducting state. Thus, a sufficient current is supplied from the external power supply voltage Vocc to the internal power supply voltage line Vicc, whereby the internal power supply voltage Vicc is increased.

As described above, the output level of the output circuit 112 is fed back to the differential amplifier 111, whereby the internal power supply Vicc is made constant. In this case, if there is a large delay in the feedback path of the differential amplifier 111, the output level of the output circuit 112, namely, the internal power supply voltage Vicc is brought into an oscillating state and a ripple component is superimposed onto the potential level. However, such oscillation of the output level of the output circuit is suppressed by sufficiently reducing the delay of feedback in the differential amplifier 111.

FIG. 4 is a graph showing a dependency characteristic of the internal power supply voltage Vicc generated by the internal voltage down converter shown in FIG. 3 on the external power supply voltage Vocc, as disclosed by Furuyama et al in the above-mentioned document. Referring to FIG. 4, the ordinate represents the internal power supply voltage Vicc and the abscissa represents the external power supply voltage Vocc. As seen from FIG. 4, the internal power supply voltage Vicc obtained by voltage conversion is maintained at a constant value of about 3.5 V set as the reference voltage Vref, in the range where the external power supply voltage Vocc is about 3.5 V or more. It is also seen that in the case of the external power supply voltage Vocc of 7 V, the internal power supply voltage Vicc is about 4 V.

If the semiconductor device is a memory device such as a DRAM, that is, if the function circuit in FIG. 1 includes a memory cell array, a substrate voltage generator 104 is provided in general as shown in FIG. 1. The substrate voltage generator 104 applies a prescribed negative potential to the substrate 100 if the semiconductor substrate 100 is a P type substrate. The purposes of applying such constant negative bias voltage to the P type semiconductor substrate are (1) to prevent injection of electrons into the substrate due to undershoot of a signal on a signal line, (2) to make stable the threshold voltage and operation characteristics by attenuation of the substrate effect of n channel MOS transistors, (3) to enhance the speed of operation of MOS transistors by reducing the stray capacitance involved in the junction capacitance between the substrate and an N type impurity layer, (4) to prevent generation of a parasitic MOS transistor by preventing formation of an inversion layer at an insulating film portion for element isolation (a field oxide film), (5) to prevent rise of the substrate potential due to a capacitance coupling between the power supply voltage line and the substrate, etc. The above-mentioned substrate effect is a phenomenon in which the threshold voltage and drain current etc. of an n channel MOS transistor formed on the surface of the semiconductor substrate vary according to the potential of the semiconductor substrate.

FIG. 5A shows a specific construction of a generally used substrate voltage generator. Referring to FIG. 5A, the substrate voltage generator 104 includes a ring oscillator 201 performing oscillation at a prescribed frequency, and a charge pump circuit 202 responsive to an oscillation signal from the ring oscillator 201 for injecting electrons into the semiconductor substrate and biasing the substrate at a prescribed negative potential (in the case of the semiconductor substrate of the P type). The ring oscillator 201 includes inverters I1, I2 ..., Im cascade-connected by an odd number of stages. An output of the inverter Im of the final stage is connected to an input portion of the inverter I1 of the first stage. The oscillation frequency of the ring oscillator 201 is determined mainly by the number of stages of the connected inverters, and the delay time in each of the inverters I1 to Im.

The charge pump circuit 202 includes a capacitor C1 having one electrode receiving an output signal f from the ring oscillator 201, an n channel MOS transistor NT11 having its gate and one electrode (drain) connected to the other electrode (node N20) of the capacitor C1, and the other conduction terminal connected to the ground potential Vss, and an n channel MOS transistor NT10 having one conduction terminal and a gate connected to the semiconductor substrate, and the other conduction terminal connected to the node N20. A connection point between the gate and one conduction terminal of the transistor NT10 is an output portion of the substrate bias voltage $V_{BB}$. Next, operation of this substrate voltage generator will be described.

Let us now assume a case in which the threshold voltage of the MOS transistors NT10 and NT11 is Vtn, H level of the oscillation signal f is Vcc (i.e., the operation power supply voltage level), and L level is Vss. When the oscillation signal f rises to H level, a charge determined by a product of the capacitance of the capacitor C1 and the H level of the oscillation signal f is injected into the node N10 due to the capacitance coupling of the capacitor C1, whereby the potential of the node N10 rises. As a result, the transistor NT10 is brought into an off state and the transistor NT11 is brought into an on state. The increased potential of the node N20 is discharged by the transistor NT11 in the on state and the potential of the node N10 becomes equal to Vss+Vtn at the time of the first charge injecting operation.

Then, when the oscillation signal f falls to L level, the charge at the node N20 is drawn by the capacitance coupling of the capacitor C1, whereby the potential of the node N20 is lowered. At this time, the transistor NT10 is turned on and the transistor NT11 is turned off. Thus, the charge is drawn from the semiconductor substrate and the potential of the semiconductor substrate is slightly lowered.

By repeating the above-mentioned operation, the potential of the semiconductor substrate is gradually lowered by the drawal of the charge, namely, injection of electrons, and finally the potential attains the following negative potential:

$$2 \cdot Vtn - Vcc.$$

Normally, the inverters I1 to Im included in the ring oscillator 201 as described above are formed by CMOS transistors (i.e., inverters including p channel MOS transistors PQ and N channel MOS transistors NQ) in the conventional structure as shown in FIG. 5B, and the external power supply voltage Vocc is used as the operation power supply voltage.

Now, the semiconductor device will be described by taking an example of a DRAM. It is possible to utilize two types of voltages, i.e., the external power supply voltage Vocc and the internal power supply voltage Vicc as the operation power supply voltage of the semiconductor device having the internal voltage down converter. Thus, either of the following voltages:

(1) the externally applied power supply voltage Vocc, (2) the internal power supply voltage Vicc stepped-down by the internal voltage down converter can be used as the operation power supply voltage of the substrate voltage generating circuit.

A method of supplying the operation power supply voltage to the DRAM may be either of the following two methods.

A: Only a circuit of an input/output portion such as a data input/output buffer or an address buffer communicating signals with an external device is operated by the external power supply voltage Vocc, and other peripheral circuit and memory array portion are all operated by the internal power supply voltage Vicc. This is based on the following features. If the external device includes a MOS transistor operating with an operation power supply voltage of 5 V, the input/output circuit needs to input and output a signal having a swing of 5 V to 0 V, and in the internal circuit (including both the peripheral circuitry and the memory array portion), the use of the internal power supply voltage Vicc makes it possible to improve reliability and to attain a low power consumption characteristic and high-speed operability for the below described reasons.

The change amount of the internal power supply voltage Vicc is smaller than the change amount of the external power supply voltage Vocc. In addition, it is not necessary to give a large tolerance to operation timing in the semiconductor memory device. More specifically stated, the operation speed of the peripheral circuitry proportional to the driving capability of the transistor greatly depends on the power supply voltage, particularly the gate voltage. The circuit components such as the memory array and the sense amplifiers have a large load capacitance and accordingly the operation speed thereof is determined by a CR time constant of the load capacitance and the resistance, and have not so large voltage dependency as in the peripheral circuitry. Consequently, if the internal power supply voltage Vicc is used as the operation power supply voltage of the peripheral circuitry, it becomes possible to make the operation speed of the peripheral circuitry and that of the memory array portion coincide and to shorten the access time.

B: Only the memory array portion is operated by the internal power supply voltage Vicc stepped-down and other input/output circuits and peripheral circuitry are all operated by the external power supply voltage Vocc. This method is a method of designing a DRAM based on the conventionally used design method with as little change as possible. In the memory array portion, a reliability problem often occurs in memory cells due to a word line receiving the highest voltage and the drive circuit thereof, etc. and it is necessary to operate the memory array portion by the internal power supply voltage Vicc.

From the foregoing considerations, there are four combinations in the power supply voltage applying system for the DRAM and the voltage applying system for the substrate voltage generator. Discussions will be made in the following on the combinations of the respective power supply voltage applying systems.

(i) In the case of combination of (1)—A above

As shown in FIG. 4, the internal power supply voltage Vicc is maintained at a substantially constant value even if the external power supply voltage Vocc becomes higher than Vref. For example, if the external power supply voltage Vocc increases to 7 V, the internal power supply voltage Vicc supplied to the peripheral circuitry and memory array portion is about 4 V. At this time, a bias voltage generated by the substrate voltage generator 104 becomes about $-5$ V from the relation of $(2 \cdot Vth - Vocc)$ assuming that the threshold voltage Vtn is 1.0 V, and the substrate bias becomes deep.

If the external power supply voltage Vocc is 5 V, the substrate bias voltage is about $-3$ V and the substrate bias becomes considerably deep compared with the internal power supply voltage Vicc supplied to the memory array portion.

Normally, in the case of a conventional DRAM not performing step-down of the power supply voltage, the substrate bias voltage thereof is about $-3$ V assuming that the operation power supply voltage is 5 V (with the threshold voltage Vth=1.0 V).

Consequently, in the case of this combination, there is a problem that the substrate bias voltage becomes deep in the memory array portion compared with the operation power supply voltage. Thus, if the substrate bias is too deep, the following disadvantages are involved in general. The threshold voltage of the MOS transistor is increased, and, in addition, a depletion layer formed in a data storage area in a memory cell extends, producing many regions collecting electric charge generated in the substrate by $\alpha$ rays. Thus, there is a high probability of storing the electrons generated by the $\alpha$ rays in the storage areas, causing an increase in soft errors in the semiconductor memory device.

If the operation power supply voltage of the substrate voltage generator increases, the operation speed of the inverter included therein becomes fast and the oscillation frequency of a ring oscillator 201 (as shown in FIG. 5A) increases and consumed current increases. The quantity of electrons injected by a charge pump circuit 202 (as shown in FIG. 5A) into the substrate is determined mainly by the oscillation frequency of the ring oscillator 201 and the capacitance value of the capacitor included in the charge pump circuit 202. Thus, if the frequency of the ring oscillator is increased, the quantity of electrons injected from the charge pump circuit 202 is increased and the injected electrons in the substrate further generate electrons therein due to an impact ionization phenomenon or the like. As a result, a phenomenon of destructing the stored data in the memory cells is liable to occur.

(ii) In the case of combination of (1)—B above

In this combination also, the substrate voltage generator operates by the external power supply voltage Vocc as the operation power supply voltage and the same problem as in the above-mentioned combination of (1)—A occurs. Thus, the reliability of the memory device and the low power consumption characteristic are deteriorated.

(iii) In the case of combination of (2)—A above

When the external power supply voltage Vocc is applied to the memory device, a certain time is required until the internal voltage down converter becomes stable and supplies a stable internal power supply voltage Vicc. This is because it takes time until the reference voltage generating circuit 110 and the differential amplifier 111 shown in FIGS. 2 and 3 both become stable and operate normally.

In this case, the substrate voltage generator 104 operates with the internal power supply voltage Vicc as the operation power supply voltage and accordingly it takes much time until the potential of the semiconductor substrate attains a prescribed negative potential and becomes stable at this negative potential. In addition, in this case, in the DRAM of the CMOS structure, the substrate potential is liable to rise (to attain a positive potential) due to a capacitance coupling between the power supply line (the external power supply voltage applying line) and the substrate at the time of starting the application of the external power supply voltage. In consequence, a parasitic thyristor normally formed in the CMOS transistor is rendered conductive due to the rise of the substrate potential and a latch-up phenomenon in which current flows from the power supply voltage applying line to the ground line is liable to occur.

The input/output circuit (such as the output transistor) operating by the external power supply voltage Vocc as the operation power supply voltage supplies a large current flowing from the external power supply voltage to the substrate when the external power supply voltage Vocc rises for some cause, and holes are injected into the semiconductor substrate due to the impact ionization phenomenon caused by the large current.

The substrate voltage generator 104 operates by the internal power supply voltage Vicc as the operation power supply voltage and the substrate bias potential is set shallower compared with a case for the external power supply voltage. Consequently, if such external power supply voltage Vocc rises rapidly, the semiconductor substrate potential rises since the charge pump circuit 202 only supplies electrons according to the internal power supply voltage. Thus, even in normal operation, the latch-up phenomenon in the semiconductor memory device is liable to occur and the threshold voltages of the MOS transistors included in not only the memory array portion but also the peripheral circuitry fluctuate, causing damage to the reliability of the semiconductor memory device.

(iv) In the case of combination of (2)—B above

In this case also, the substrate voltage generator operates by the internal power supply voltage Vicc as the operation power supply voltage. Thus, for the same reasons as in the case of the combination of (2)—A, much time is required until the potential of the semiconductor substrate becomes stable to be a prescribed bias potential, and there is a high possibility of raising the potential of the semiconductor substrate, causing deterioration of the reliability of the semiconductor memory device.

The above-mentioned discussions are applicable to memory devices such as SRAMs, except for the problem of soft errors. Those discussions are also applicable generally to semiconductor devices where the semiconductor substrate is biased at a prescribed bias potential.

As described above, in a semiconductor device containing an internal voltage down converter, the conventional substrate voltage generator operates only by the external power supply voltage Vocc or the internal power supply voltage Vicc and thus an optimum substrate bias potential cannot be applied to the semiconductor substrate, resulting in deterioration of the reliability of the semiconductor device.

The structure in which a semiconductor substrate is short-circuited at a ground potential through a substrate voltage generator until the operation power supply voltage becomes stable at the time of turning on the power supply is disclosed in Japanese Patent Laying-Open No. 63-306594.

In addition, Japanese Patent Laying-Open Nos. 62-36797 and 60-25309 disclose structures as described below. In a semiconductor device having an internal voltage down converter, in order to prevent a latch-up phenomenon caused by transient current flowing at the time of turning on the power supply or at the time of operating the device and the circuit causing the transient current operated by an internal power supply voltage, the timing for starting operation of a substrate voltage generator by an external power supply voltage is set to an operation start time or a time thereafter of the circuit operating by the internal power supply voltage as the operation power supply voltage.

All of those prior art circuits intend to prevent the latch-up phenomenon caused by rise of the substrate potential in the transient state at the time of turn-on of the power supply or the like, and those substrate voltage generators all use the external power supply voltage as the operation power supply voltage.

SUMMARY OF THE INVENTION

An object of the present invention is to provide an improved substrate voltage generator for a semiconductor device having a conventional internal voltage down converter as described above.

Another object of the present invention is to provide a substrate voltage generator having low consumption of current and capable of supplying an optimum substrate bias voltage stably to a semiconductor substrate in a semiconductor device having a plurality of operation power supply voltages.

Still another object of the present invention is to provide a substrate voltage generator having low consumption of current and capable of stably supplying an optimum substrate bias voltage according to an operation power supply voltage to a substrate region in a semiconductor device having a plurality of operation power supply voltages.

A further object of the present invention is to provide a substrate voltage generator having low consumption of power and capable of stably supplying an optimum substrate bias voltage to a semiconductor substrate at any time, i.e., at the time of turn-on of power supply for a semiconductor device and at the time of normal operation thereof.

A still further object of the present invention is to provide an improved substrate voltage generating method for a semiconductor device having a conventional internal voltage down converter as described above.

A still further object of the present invention is to provide a substrate voltage generating method for supplying an optimum substrate bias voltage stably with low consumption of current to a semiconductor substrate in a semiconductor device having a plurality of operation power supply voltages.

A still further object of the present invention is to provide a substrate voltage generating method for supplying stably with low consumption of current an optimum substrate bias voltage according to an operation power supply voltage to a substrate region in a semiconductor device having a plurality of operation power supply voltages.

A still further object of the present invention is to provide a substrate voltage generating method for supplying stably with low consumption of power an optimum substrate bias voltage to a semiconductor substrate at any time, i.e., at the time of turn-on of power supply for a semiconductor device and at the time of normal operation thereof.

A substrate voltage generator according to the present invention includes: a circuit for generating an optimum substrate voltage with respect to an internal stepped-down voltage in response to a state of the substrate voltage or the internal steeped-down voltage in a semiconductor device having a circuit operated by an external power supply voltage as an operation power supply voltage, and a circuit operated by the internal stepped-down voltage as an operation power supply voltage.

More specifically, a first substrate voltage generating circuit according to the present invention includes: first substrate bias applying means operated by an external power supply voltage as an operation power supply voltage for applying a first bias voltage to a semiconductor substrate; second substrate bias applying means operated by an internal stepped-down power supply voltage as an operation power supply voltage for applying a second bias voltage to the semiconductor substrate; means for detecting the application of the external power supply voltage; and means responsive to an output signal from the power supply voltage application detecting means for selectively activating the first and second substrate bias applying means.

A second substrate voltage generating circuit according to the present invention includes: first substrate bias applying means operated by an external power supply voltage as an operation power supply voltage for applying a first bias voltage to a semiconductor substrate; second substrate bias applying means operated by an internal stepped-down power supply voltage as an operation power supply voltage for applying a second bias voltage to the semiconductor substrate; means for detecting a potential of the semiconductor substrate; and means responsive to an output signal from the substrate potential detecting means for selectively activating the first and second substrate bias applying means.

A third substrate voltage generating circuit according to the present invention, in a semiconductor device having an internal voltage down converter including means for generating an internal stepped-down power supply voltage and regulation means responsive to the generated internal stepped-down power supply voltage for generating a regulation signal regulating the generated voltage level of the internal stepped-down power supply voltage generating means and applying the regulation signal to the internal stepped-down power supply voltage generating means, includes: first substrate applying means having a first driving capability for applying a first bias voltage to a semiconductor substrate; second substrate bias applying means having a larger driving capability than the first driving capability for generating a second bias voltage and applying the generated second bias voltage to the semiconductor substrate; and means responsive to the regulation signal for selectively activating the first and second substrate bias applying means.

A fourth substrate voltage generating circuit according to the present invention, in a semiconductor device where a circuit element operated by an external power supply voltage as an operation power supply voltage and a circuit element operated by an internal stepped-down power supply voltage as an operation power supply voltage are formed in different first and second semiconductor regions, includes: first substrate bias applying means for applying a first bias voltage to the first semiconductor region; second substrate bias applying means for applying a second bias voltage to the second semiconductor region; first control means for controlling the bias voltage applying operation of the first substrate bias applying means; and second control means for controlling the bias voltage applying operation of the second substrate bias applying means, the first and second control means operating independently to set the first and second bias voltages to values corresponding to the external power supply voltage and the internal stepped-down power supply voltage, respectively.

In the first substrate voltage generating circuit, the first and second substrate bias applying means are selectively operated dependent on the state of the external power supply voltage, whereby rise of the substrate potential at the time of turn-on of the external power supply can be prevented and, after the external power supply voltage becomes stable, the optimum bias voltage can be supplied to the semiconductor substrate with low consumption of current.

In the second substrate voltage generating circuit, the first and second substrate bias applying means are selectively operated dependent on the substrate potential, whereby the optimum substrate bias voltage can be stably supplied to the semiconductor substrate with low consumption of current.

In the third substrate voltage generating circuit, the first and second substrate bias applying means are selectively operated dependent on the level of the internal power supply voltage, whereby the device can be prevented from being affected by changes in the internal power supply voltage and the optimum bias voltage can be supplied to the semiconductor substrate according to an operation state of the device.

In the fourth substrate voltage generating circuit, the substrate bias applying means are operated independently according to each of the plurality of operation power supply voltages and thus the optimum substrate bias voltage can be supplied to the semiconductor substrate according to the level of the operation power supply voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
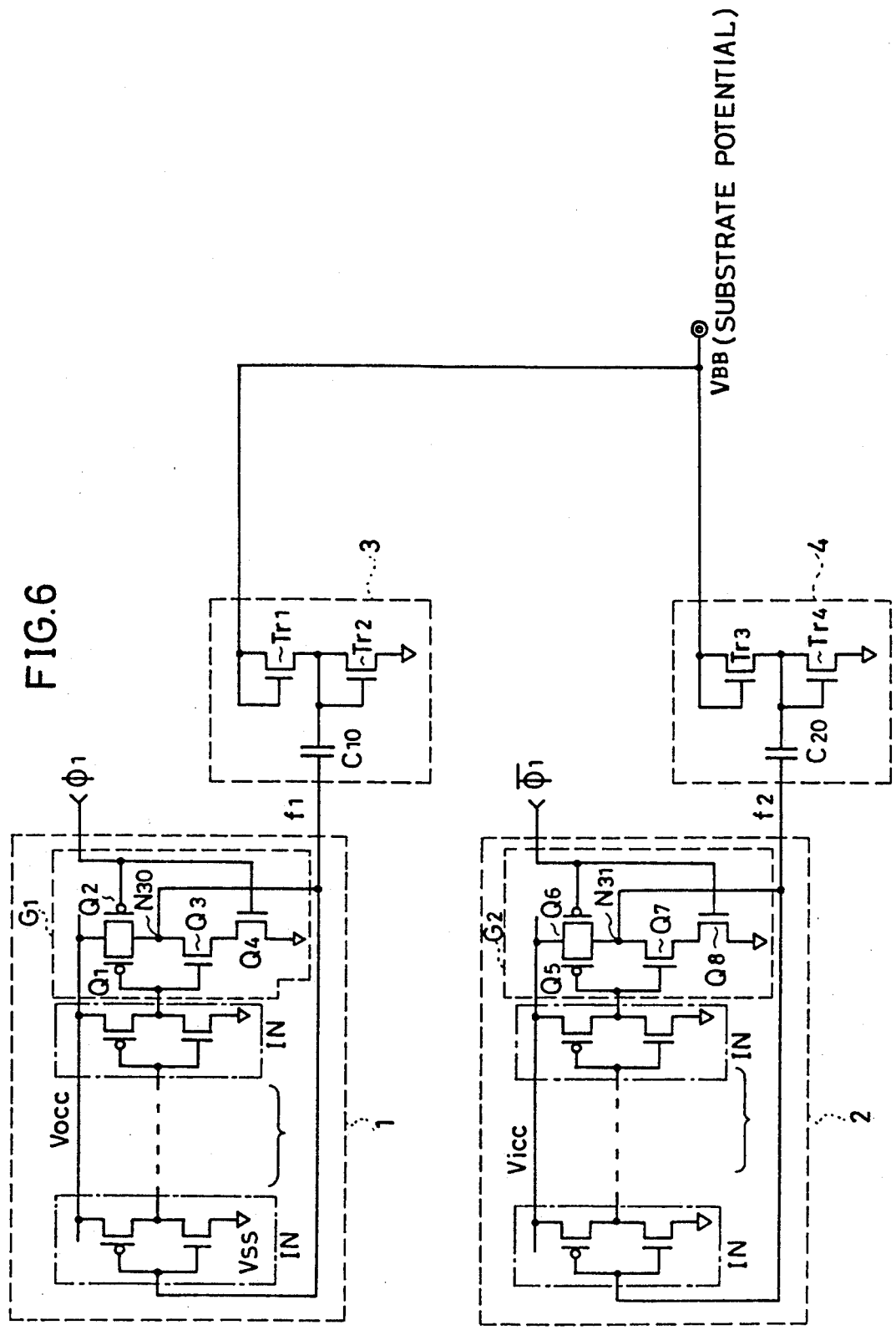
FIG. 6 is a diagram showing a construction of a substrate voltage generator according to an embodiment of the present invention.

FIG. 6 is a diagram showing a construction of a substrate voltage generator according to an embodiment of the present invention. Referring to FIG. 6, the substrate voltage generator includes: a first ring oscillator 1 operating with an external power supply voltage Vocc as an operation power supply voltage; a second ring oscillator 2 operating with an internal power supply voltage Vicc stepped-down from the external power supply voltage as an operation power supply voltage; a first charge pump circuit 3 supplying a first bias voltage to a semiconductor substrate in response to an oscillation signal f1 from the first ring oscillator 1; and a second charge pump circuit 4 supplying a second bias voltage to the semiconductor substrate in response to an oscillation signal f2 from the second ring oscillator 2.

Although outputs of the first and second charge pump circuits 3 and 4 are represented as being connected to the semiconductor substrate through a common terminal, another structure may be adopted in which bias voltages from those outputs are applied to the semiconductor substrate through different semiconductor regions (e.g., $P^+$ type impurity regions in the case of a P type semiconductor substrate).

The first ring oscillator 1 includes inverters IN cascade-connected in m stages (m being an even number), and a gate circuit G1 controlling the oscillating operation of the first ring oscillator 1 in response to a control signal $\phi 1$. The gate circuit G1 includes: a p-channel MOS transistor Q1 and an n channel MOS transistor Q3 constituting an inverter; and a p channel MOS transistor Q2 and an n channel MOS transistor Q4 controlling the operation of the inverter (i.e., the transistors Q1, Q3) in response to the control signal $\phi 1$. The transistors Q1 and Q3 receive at their gates an output of the inverter IN of the final stage. The transistors Q2 and Q3 receive at their gates the control signal $\phi 1$. The transistors Q1 and Q2 are connected in parallel between the external power supply voltage Vocc and an output terminal N30. The transistors Q3 and Q4 are connected in series between the output terminal N3 and the ground potential Vss. The node N30 is also connected to an input portion of the inverter IN of the first stage.

The second ring oscillator 2 includes inverters IN cascade-connected in n stages (n being an even number), and a gate circuit G2 controlling the oscillating operation of the second ring oscillator 2 in response to a complementary control signal $\overline{\phi 1}$. The gate circuit G2 includes: a p channel MOS transistor Q5 and an n channel MOS transistor Q7 constituting an inverter; and a p channel MOS transistor Q6 and an n channel MOS transistor Q8 controlling the operation of the inverter i.e., the transistors Q5, Q7) in response to the complementary control signal $\overline{\phi 1}$. The transistors Q5 and Q6 are connected in parallel between the internal power supply voltage Vicc and an output terminal N31. The transistors Q7 and Q8 are connected in series between the output terminal N31 and the ground potential Vss. The terminal N31 is also connected to an input portion of the inverter IN of the first stage.

The control signal $\phi 1$ is a signal generated at the time of applying the external power supply voltage Vocc to the semiconductor device.

The charge pump circuits 3 and 4 include charge pump capacitors C10, C20 and charge drawing transistors Tr1, Tr2, and Tr3, Tr4, respectively, as in the prior art.

Figure 7:
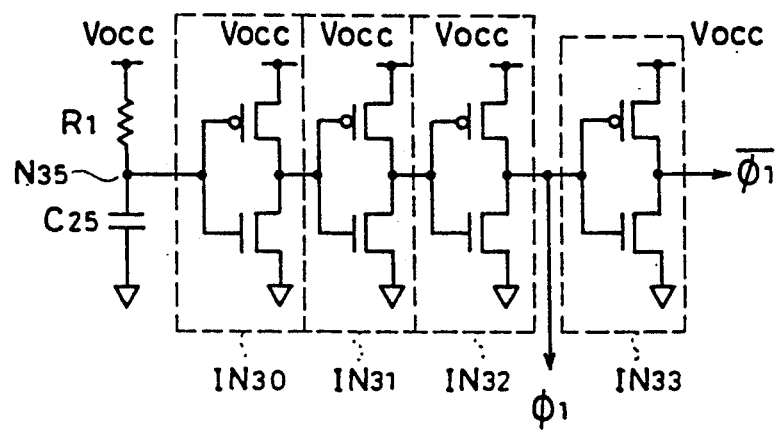
FIG. 7 is a diagram showing an example of a circuit construction for generating a power supply turn-on detecting signal shown in FIG. 1.
Figure 8:
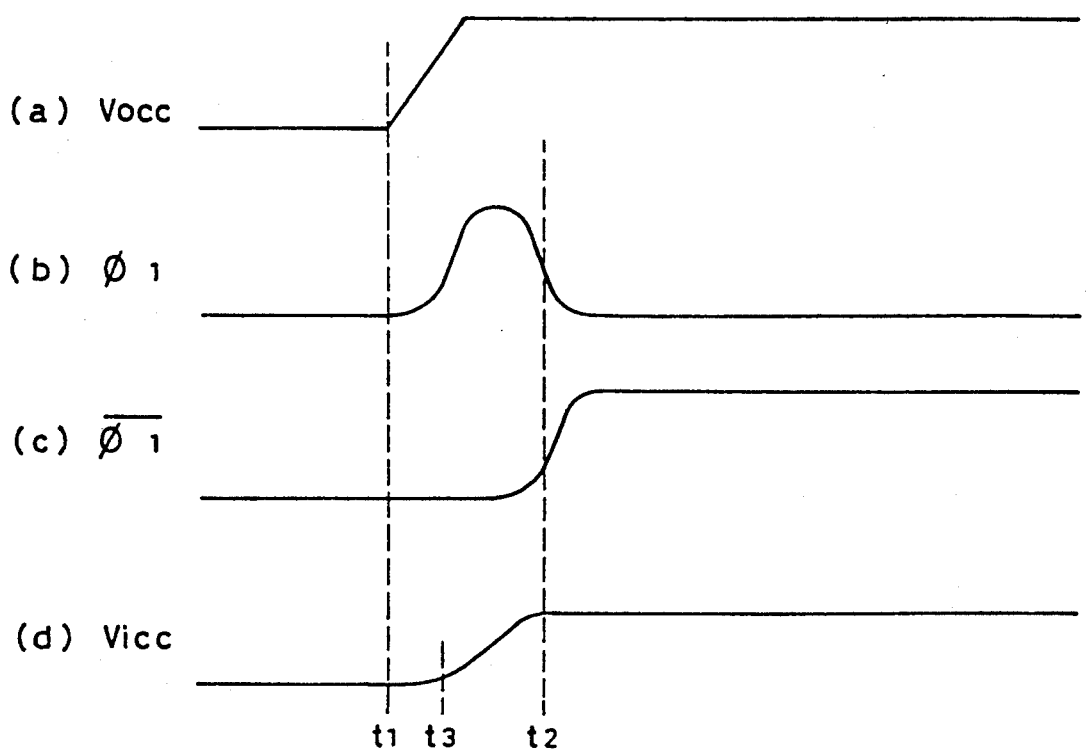
FIGS. 8(a-d) are waveform diagrams showing operation of the power supply turn-on detecting circuit shown in FIG. 7.

FIG. 7 shows a construction of a circuit for generating the control signals $\phi 1$ and $\overline{\phi 1}$, and FIG. 8 shows a waveform diagram of the control signal generating circuit.

Referring to FIG. 7, the control signal generating circuit includes: a resistor R1 connected between the external power supply voltage Vocc and a node N35; a capacitor C25 connected between the node N35 and the ground potential Vss; inverters IN30, IN31 and IN32 cascade-connected in these stages for generating the control signal $\overline{\phi 1}$ in response to a signal potential of the node N35; and an inverter IN33 for generating the complementary control signal $\phi 1$ in response to the control signal $\phi 1$. The inverters IN30 to IN33 operate with the external power supply voltage Vocc as the operation power supply voltage. Before explanation of operation of the substrate voltage generator shown in FIG. 6, operation of the control signal generating circuit will be described with reference to the operation waveform diagram of FIG. 8.

Before time t1, the external power supply voltage Vocc is not applied to the semiconductor device and the control signals $\phi 1$, $\overline{\phi 1}$ are both at L level.

When the external power supply voltage Vocc starts to be applied at the time t1, the capacitor C25 is charged through the resistor R1 and the potential of the node N35 rises. The potential rising speed of the node N35 is determined by a resistance value of the resistor R1 and a capacitance value of the capacitor C25 (RC time constant).

The inverter IN30 determines the signal potential of the node N35 to be L until the potential of the node N35 exceeds an input logical threshold voltage of the inverter IN30. Consequently, in this period, the control signal $\phi 1$ rising to H level is provided from the inverter IN32. The time of rise of the control signal $\phi 1$ comes later than the time t1 because of the delay times of the inverters IN30 to IN32 and insufficient charging operation of the output portions of the inverters IN30 to IN32 at the rise of the external power supply voltage Vocc.

The inverter IN33 inverts the control signal $\phi 1$ and consequently provides the complementary control signal $\overline{Q1}$ of L level. The complementary control signal $\overline{\phi 1}$ rises a little after the start of application of the external power supply voltage Vocc until the control signal $\phi 1$ rises to H level; however, the rising level of the complementary control signal is very small and can be disregarded because the external power supply voltage Vocc is in a transient state and has a small charging capability in its output portion, and thus the level can be regarded as L level.

When the charge potential of the node N35 exceeds the input logical threshold value of the inverter IN30 at time t2, the control signal $\phi 1$ falls to L level, while the complementary control signal $\overline{\phi 1}$ rises to H level.

At time t3 between the time t1 and the time t2, the internal power supply voltage Vicc begins to rise and at the time t2, it attains the prescribed potential level and is in a stable state.

Thus, the control signal $\phi 1$ is at H level in a period from the start of application of the external power supply voltage Vocc until the internal power supply voltage Vicc attains the stable state.

Referring to FIG. 8, the control signal $\phi 1$ is represented as starting to rise at the time t3 the internal power supply voltage Vicc rises; however, the rise start timings of Vicc and $\phi 1$ do not need to be coincident and those rise start timings can be set in an arbitrary manner.

The timing of fall of the control signal $\phi 1$ to L level is set substantially equal to the timing of transition of the internal power supply voltage vicc to the stable state; however, a margin of time may be provided and the control signal $\phi 1$ may be made to fall to L level at an arbitrary timing after the time t2.

The period of H level of the control signal φ1 is set to a suitable value by regulating the RC time constant of the resistor R and capacitor C30 and the delay time of the inverters IN30 to IN32.

Figure 1:
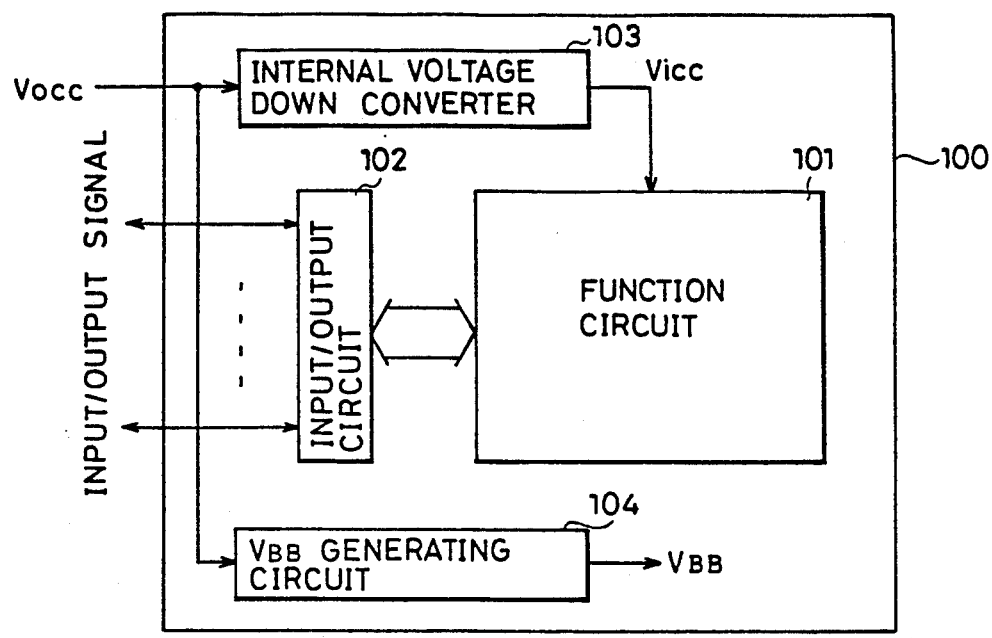
FIG. 1 is a schematic diagram showing an entire construction of a conventional semiconductor device having an internal voltage down converter.
Figure 2:
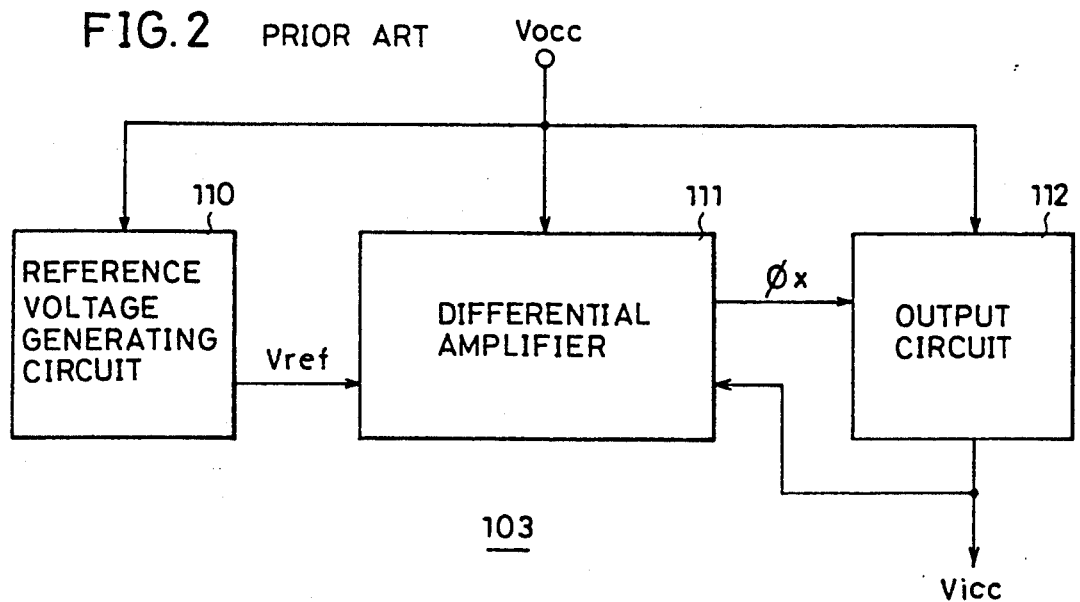
FIG. 2 is a block diagram showing a schematic construction of the internal voltage down converter shown in FIG. 1.

The rise timing of the internal power supply voltage Vicc comes later than the time of start of application of the external power supply voltage Vocc because of delay time in the internal voltage down converter shown in FIGS. 2 and 3 for example.

Referring to FIG. 6, the operation of the substrate voltage generator according to the embodiment of the present invention will be described.

As described above, the control signal φ1 is at H level and the control signal $\overline{\phi1}$ is at L level in the period from the start of application of the external power supply voltage Vocc until at least the internal power supply voltage Vicc attains the stable state. In the first ring oscillator 1, the transistor Q2 is turned off and the transistor Q4 is turned on. The gate circuit G1 operates as the inverter and the first ring oscillator 1 performs oscillating operation and provides an oscillation signal f1. In response to the oscillation signal f1, the first precharge circuit 3 performs charge pump operation to lower the substrate voltage at high speed. In consequence, it is possible to generate the substrate bias voltage at high speed, to suppress rise of the potential level of the semiconductor substrate due to transient current caused by the application of the external power supply voltage, and to suppress effectively the latch-up phenomenon.

In the second ring oscillator 2, the transistor Q6 is turned on and the transistor Q8 is turned off because the complementary control signal $\overline{\phi1}$ is at L level. In consequence, the node N31 is charged through the transistor Q6 and rises to H level. The potential of the node N31 is fed back to the gate of the transistor Q5 through the n stages of inverters IN, whereby the transistor Q5 is turned on. As a result, the output signal f2 from the node N31 is fixed to H level and the charge pump circuit 4 does not perform charge pump operation. Thus, in the period of the transient state of the internal power supply voltage Vicc, the second charge pump circuit 4 does not perform charge pump operation.

When the internal power supply voltage Vicc becomes stable, the control signal φ1 falls to L level and the complementary control signal $\overline{\phi1}$ rises to H level. The signal f1 from the first ring oscillator 1 is fixed to H level and the signal f2 from the second ring oscillator 2 is used as the oscillation signal. Thus, the first charge pump circuit 3 stops charge pump operation, while the second charge pump circuit 4 performs charge pump operation. The reasons for operating only the second charge pump circuit 4 after the internal power supply voltage Vicc becomes stable are as follows. circuit to the semiconductor substrate depends on the operation power supply voltage of the ring oscillator as described above. Accordingly, even after the internal power supply voltage Vicc becomes stable, if charge pump operation is performed through the ring oscillator 1 using the external power supply voltage Vocc, the substrate bias becomes too deep for the circuit operating with the internal power supply voltage Vicc as the operation power supply voltage. Such a deep substrate bias might cause rise of the threshold voltage of the MOS transistors, increase of the soft error occurrence ratio in the DRAMs due to increase of injected electrons into the substrate by the charge pump operation, etc. Therefore, by operating only the substrate voltage generating circuit (including the ring oscillator 2 and the charge pump circuit 4) using the internal power supply voltage Vicc as the operation power supply voltage with respect to the circuit portion operating with the internal power supply voltage Vicc, it becomes possible to prevent the bias from being too deep as mentioned above and to apply a desired substrate bias voltage to the semiconductor substrate.

The driving capabilities of the first substrate voltage generating circuit (i.e., the ring oscillator 1 and the charge pump circuit 3) and the second substrate voltage generating circuit (i.e., the ring oscillator 2 and the charge pump circuit 4) have not been particularly mentioned, but those driving capabilities may be equal or different. The driving capability of each of those substrate generating circuits is determined mainly by the oscillation frequency of the ring oscillator and the capacitance value of the capacitor of the charge pump circuit (in the case where the parameters of the transistors used are the same). The oscillation frequency of the ring oscillator increases by decreasing the number of stages of inverters included therein or reducing the delay time of the inverters. Consequently, the parameters determining those driving capabilities may be equal or different with respect to both of the substrate voltage generating circuits.

However, with a view to preventing rise of the substrate potential at the time of application of the external power supply voltage, it is preferable to increase the driving capability of the first substrate voltage generating circuit operating in response to the external power supply voltage. Thus, it becomes possible to lower rapidly the substrate potential at the time of starting application of the external power supply voltage and to effectively suppress the latch-up phenomenon or the like.

Figure 9:
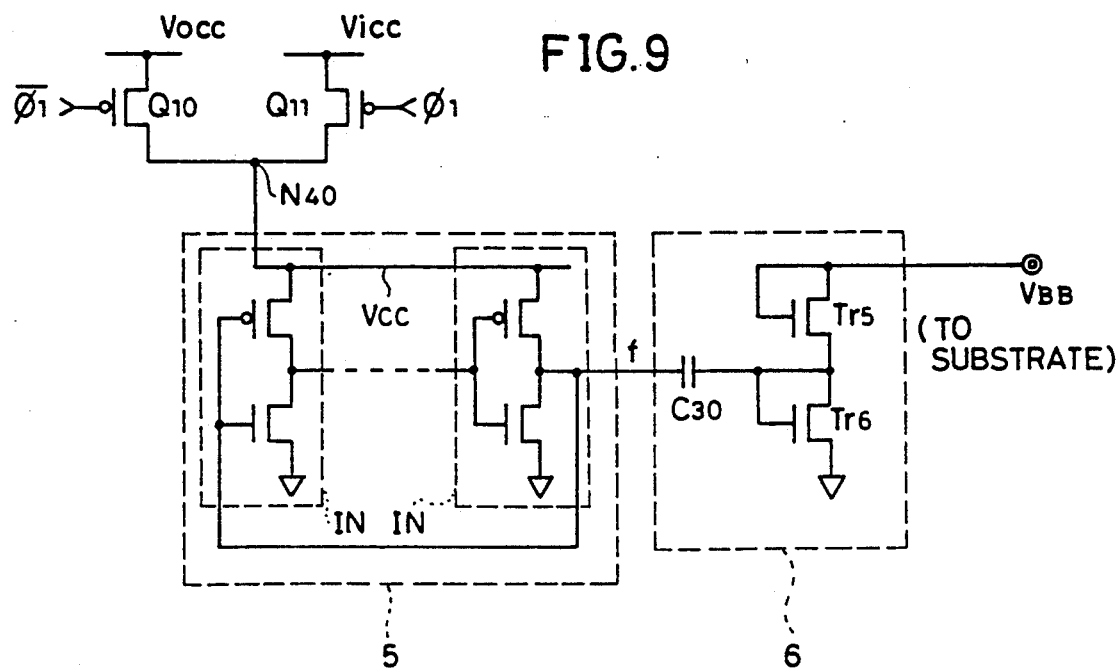
FIG. 9 is a diagram showing a construction of a substrate voltage generator according to a second embodiment of the present invention.

FIG. 9 is a diagram showing a construction of a substrate voltage generator according to another embodiment of the present invention. Referring to FIG. 9, the substrate voltage generator includes: a p channel MOS transistor Q10 connected between an external power supply voltage Vocc and a node N10 and turned on in response to the complementary control signal $\overline{\phi1}$; a p channel MOS transistor Q11 connected between the internal power supply voltage Vicc and the node N40 and turned on in response to the control signal φ1; a ring oscillator 5 supplied with an operation power supply voltage Vcc from either of the transistors Q10 and Q11 for performing oscillating operation; and a charge pump circuit 6 generating a substrate bias voltage $V_{BB}$ in response to an oscillation signal f from the ring oscillator 5. The ring oscillator 5 includes inverters IN cascade-connected in an odd number of stages and connected in a ring form. The charge pump circuit 6 has the same construction as that of the charge pump circuits 3 and 4 shown in FIG. 6, and it includes a capacitor C30, and n channel MOS transistors Tr5 and Tr6. The control signals φ1 and $\overline{\phi1}$ applied to the gates of the transistors Q10 and Q11 are control signals generated from the external power supply voltage application detecting circuit shown in FIG. 7. Next, the operation will be described.

At the time of starting application of the external power supply voltage, the control signal $\overline{\phi1}$ is at H level, while the complementary control signal φ1 is at L level. In consequence, the transistor Q10 is turned on and the transistor Q11 is turned off. The external power supply voltage Vocc is applied to the node N40 through the transistor Q10 in the on state. The ring oscillator 5 operates with the external power supply voltage Vocc applied through the node N40 as the operation power supply voltage Vcc. The ring oscillator 5 starts the oscillating operation at a very prompt timing after the start of application of the external power supply voltage, and the charge pump circuit 6 start charge pump operation in response to the oscillation signal f from the ring oscillator 5, so as to apply a prescribed bias voltage to the substrate.

When the internal power supply voltage Vicc becomes stable after an elapse of a prescribed period from the start of application of the external power supply voltage, the control signal $\phi 1$ falls to L level and the complementary control signal $\overline{\phi 1}$ rises to H level. The transistor Q11 is turned on and the transistor Q10 is turned off. Thus, the ring oscillator 5 performs oscillating operation using the internal power supply voltage Vicc as the operation power supply voltage Vcc. In consequence, the bias voltage applied from the charge pump circuit 6 to the semiconductor substrate is a value corresponding to the internal power supply voltage Vicc, namely,—(Vicc−2·Vtn).

Thus, the construction shown in FIG. 9 also makes it possible to generate the substrate bias voltage at prompt timing after the start of application of the external power supply voltage and to prevent rise of the substrate potential and the like as in the case of the construction of the substrate voltage generator shown in FIG. 6.

In the above-described constructions, the control signals $\phi 1$, $\overline{\phi 1}$ are prepared by detection of the application of the external power supply voltage Vocc. The above-described respective substrate voltage generating circuits intend mainly to prevent rise of the substrate potential in the transient state at the time of starting application of the external power supply voltage. However, also in normal operation after the internal power supply voltage Vicc becomes stable, it sometimes happens that the substrate potential becomes shallower or deeper than the prescribed bias potential dependent on the operation state of the device.

The above-mentioned two types of operation power supply voltage applying systems A and B are utilizable for a semiconductor device containing an internal voltage down converter. Both of those voltage applying systems have a circuit operating with the external power supply voltage Vocc as the operation power supply voltage. It may happen that current flows from this circuit operating with the external power supply voltage Vocc as the operation power supply voltage into the semiconductor substrate to generate holes in the semiconductor substrate due to an impact ionization phenomenon, causing the potential of the semiconductor substrate to be shallower (less negative in p type substrate) than a prescribed bias potential. In addition, in the case of a semiconductor device formed by a memory device such as DRAM, there is little consumption of current in a standby state in which memory operation is not performed, and even if the substrate voltage generating circuit using the internal power supply voltage Vicc as the operation power supply voltage is operated, the substrate potential might be deeper (more negative in p type substrate) than the prescribed bias potential. Therefore, it is preferable to operate the substrate voltage generating circuits selectively according to the substrate potential from viewpoints of consumption of current and reliability of the semiconductor device.

Figure 10:
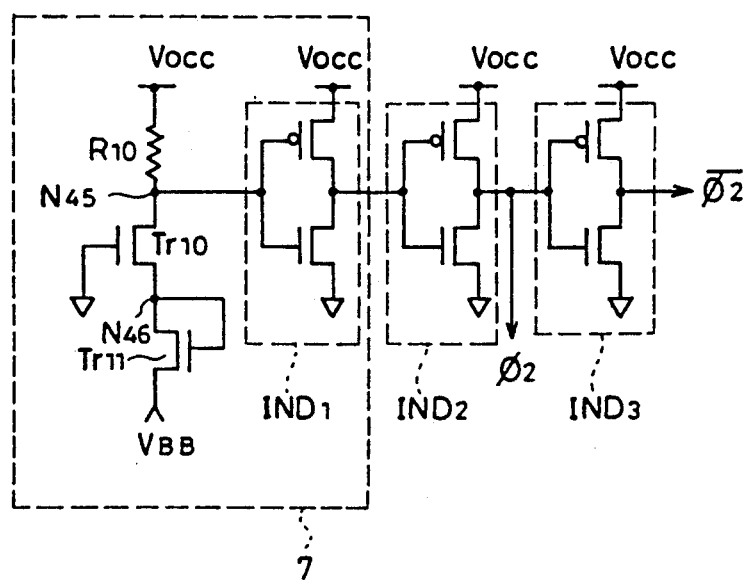
FIG. 10 is a diagram showing an example of a construction of a substrate voltage detecting circuit for generating a control signal for switching of the substrate voltage generator according to the substrate potential.

FIG. 10 is a diagram showing a construction of a circuit generating control signals according to a semiconductor substrate potential. Referring to FIG. 10, this control signal generating circuit includes: a substrate potential detecting circuit 7; an inverter IND2 generating a control signal $\phi 2$ in response to an output signal from the substrate potential detecting circuit 7; and an inverter IND3 providing a complementary control signal $\overline{\phi 2}$ in response to an output signal from the inverter IND2.

The substrate potential detecting circuit 7 includes: a resistor R10 connected between the external power supply voltage Vocc and a node N45; an n channel MOS transistor Tr10 connected between nodes N45 and N46, and receiving the ground potential Vss at its gate; an n channel MOS transistor Tr11 connected between a node N46 and the semiconductor substrate and having its gate and one conduction terminal (drain) connected together; and an inverter IND1 inverting the potential of the node N45 and providing an output obtained by the inversion. The inverters IND1 to IND3 have a CMOS structure and they operate with the internal power supply voltage Vicc as the operation power supply voltage. Next, operation of the control signal generating circuit will be described.

The resistor R10 has a large resistance value so as to supply only a negligible very small current to the substrate. The n channel MOS transistor Tr11 is diode-connected and sets the potential V(N46) of the node N46 to the following value.

$$V(N46) = V_{BB} + Vtn(Tr11)$$

where $V_{BB}$ represents the semiconductor substrate potential and Vtn(Tr11) represents the threshold voltage of the transistor Tr11.

The transistor Tr10 is turned on when a difference between the gate voltage $V_G$ thereof and the potential V(N46) of the node N46 becomes larger than the threshold voltage Vtn(Tr10) of the transistor Tr10. Thus, when $$V_G - V(N46) > Vtn(Tr10),$$

the transistor Tr10 is turned on, and when $$V_G - V(N46) < Vtn(Tr10),$$

the transistor Tr10 is turned off.

The potential of the node N45 is L when the transistor Tr10 is on, and H when the transistor Tr10 is off. In other words, when the substrate potential $V_{BB}$ becomes deeper than the prescribed bias value, the transistor Tr10 is turned on, and when it is shallower than the prescribed bias value, the transistor Tr10 is turned off. The inverter IND1 digitizes the potential of the node N45 and provides a signal of L level if the signal potential of the node N45 is higher than the input logical threshold value of the inverter IND1, and provides a signal of H level if it is lower than the input logical threshold value. Consequently, the substrate potential detecting circuit 7 provides the signal of H level when the substrate potential $V_{BB}$ is deeper than the prescribed bias value, and provides the signal of L level when it is shallower than the prescribed bias value. In response thereto, the control signal $\phi 2$ becomes L when the substrate bias is deep, and becomes H when the substrate bias is shallow. Conversely, the complementary control signal $\overline{\phi 2}$ becomes H when the substrate bias is deep, and becomes L when the substrate bias is shallow.

Those control signals $\phi 2$ and $\overline{\phi 2}$ are used in place of the control signals $\phi 1$ and $\overline{\phi 1}$ shown in FIGS. 6 and 9. In this case, when the substrate bias becomes deep, the substrate voltage generating circuit using the internal power supply voltage Vicc as the operation power supply voltage operates, so that the substrate bias becomes shallow. If the substrate bias becomes shallow, the substrate voltage generating circuit using the external power supply voltage Vocc as the operation power supply voltage operates, so that the substrate bias becomes deep.

In this construction, if the driving capability (the current supplying capability) of the substrate voltage generating circuit operating with the external power supply voltage Vocc as the operation power supply voltage is made large, it is possible to lower the shallow substrate bias rapidly to the prescribed potential. In the case of the construction of the substrate voltage generating circuit shown in FIG. 9, the oscillation frequency of the ring oscillator 5 is higher in the operation using the external power supply voltage Vocc as the operation power supply voltage than in the operation using the internal power supply voltage Vicc as the operation power supply voltage and, thus, automatically the driving capability is made larger in the operation using the external power supply voltage Vocc as the operation power supply voltage.

At the time of starting application of the external power supply voltage, the substrate potential does not attain the prescribed bias value and consequently, the control signals $\phi 2$ and $\overline{\phi 2}$ generated in response to the output of the substrate potential detecting circuit shown in FIG. 10 can be used as control signals for switching of the substrate voltage generating circuits. In this case, however, the substrate voltage generating circuit using the internal operation power supply voltage Vicc as the operation power supply voltage might be activated when the internal power supply voltage Vicc is not yet in the stable state, causing the substrate bias to be unstable. In order to stably apply the substrate bias at the time of turn-on of the power supply and at the time of normal operation, a control signal obtained by calculating a logical sum of the control signals $\phi 1$ and $\phi 2$ is used in place of the control signal $\phi 1$ and a signal obtained by calculating a logical product of the complementary control signals $\overline{\phi 1}$ and $\overline{\phi 2}$ is used in place of the complementary control signal $\overline{\phi 1}$ shown in FIGS. 6 and 9, whereby the substrate voltage generating circuits can be controlled to supply the substrate bias reliably and stably.

In addition, in this case, the driving capability of the substrate potential generating circuit operating with the external power supply voltage may be set without using such a gate circuit so that the time required for attaining the prescribed bias value may be longer than the time required for the internal power supply voltage Vicc to be stable.

In addition, in the case of operating the substrate voltage generating circuit using the internal power supply voltage Vicc in the standby state or the like in normal operation, if the substrate bias becomes too deep, both the substrate voltage generating circuits operating by the external power supply voltage Vocc and the internal power supply voltage Vicc may be adapted to 5 be in an oscillation stop state and when the substrate bias becomes shallow, the substrate voltage generating circuit using the internal power supply voltage Vicc may be operated. The selecting operation of the substrate voltage generating circuit operating by the internal power supply voltage Vicc is performed in the following manner. Since the control signal $\phi 1$ in normal operation is already fixed to L level, the control signal $\phi 1$ is inactivated or activated by the control signals $\phi 2$ and $\overline{\phi 2}$ generated in response to the substrate potential. This circuit construction can be easily realized by using NOR gates receiving the control signals $\phi 1$ and $\phi 2$.

In addition, it is possible to change the level of the internal power supply voltage Vicc supplied to the substrate voltage generating circuit according to the level of the substrate voltage $V_{BB}$. More specifically, when the substrate potential $V_{BB}$ becomes more negative and the bias becomes deep, the internal power supply voltage Vicc can be lowered and when the bias becomes shallow, the internal power supply voltage Vicc can be raised. In this case, the reference voltage Vref of the reference voltage generating circuit 110 shown in FIG. 2 can be set to a value corresponding to the level of the substrate potential $V_{BB}$. This construction can be easily 5 realized in a manner in which a load resistance and a plurality of cascade-connected PN diodes are connected for example between the external power supply voltage Vocc and the substrate potential $V_{BB}$ and the reference voltage Vref is obtained from a connection point of the resistance and diodes.

Figure 3:
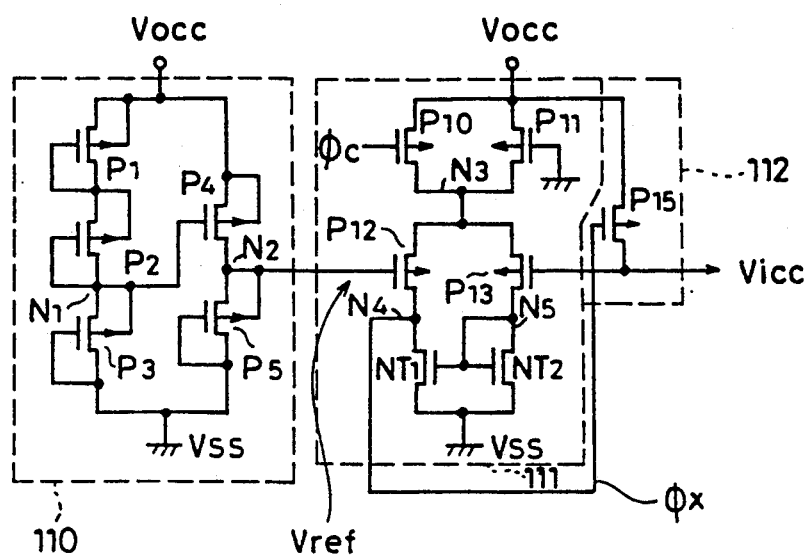
FIG. 3 is a diagram showing an example of a specific circuit construction of the internal voltage down converter shown in FIG. 2.
Figure 4:
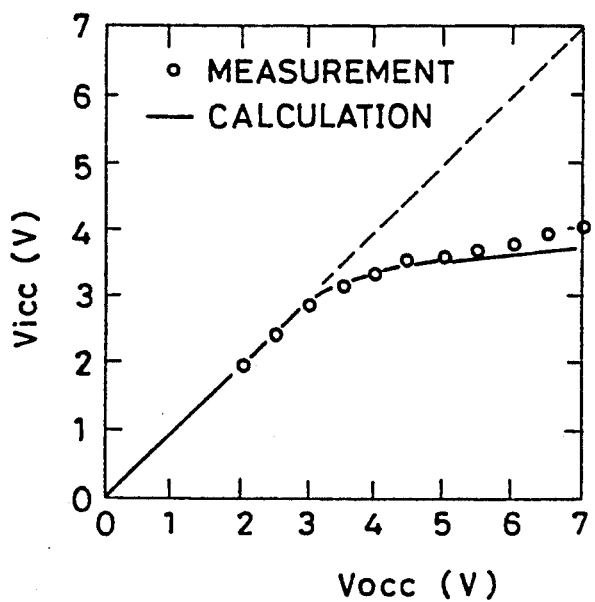
FIG. 4 is a graph showing a relationship between an external power supply voltage and an internal power supply voltage in the internal voltage down converter shown in FIG. 3.

Alternatively, the potential of the node where the drain and the gate terminal of the transistor P5 are connected in the reference voltage generating circuit 110 shown in FIG. 3 may be used as the substrate potential $V_{BB}$. Thus, it is possible to regulate the internal power supply voltage Vicc according to the substrate potential, thereby reducing the current supplying capability (driving capability) of the internal power supply voltage generating circuit operating by the internal power supply voltage Vicc and to return the substrate potential to the prescribed bias value.

In addition, a substrate voltage generator can be also realized by combining all of the above-described embodiments.

Figure 11:
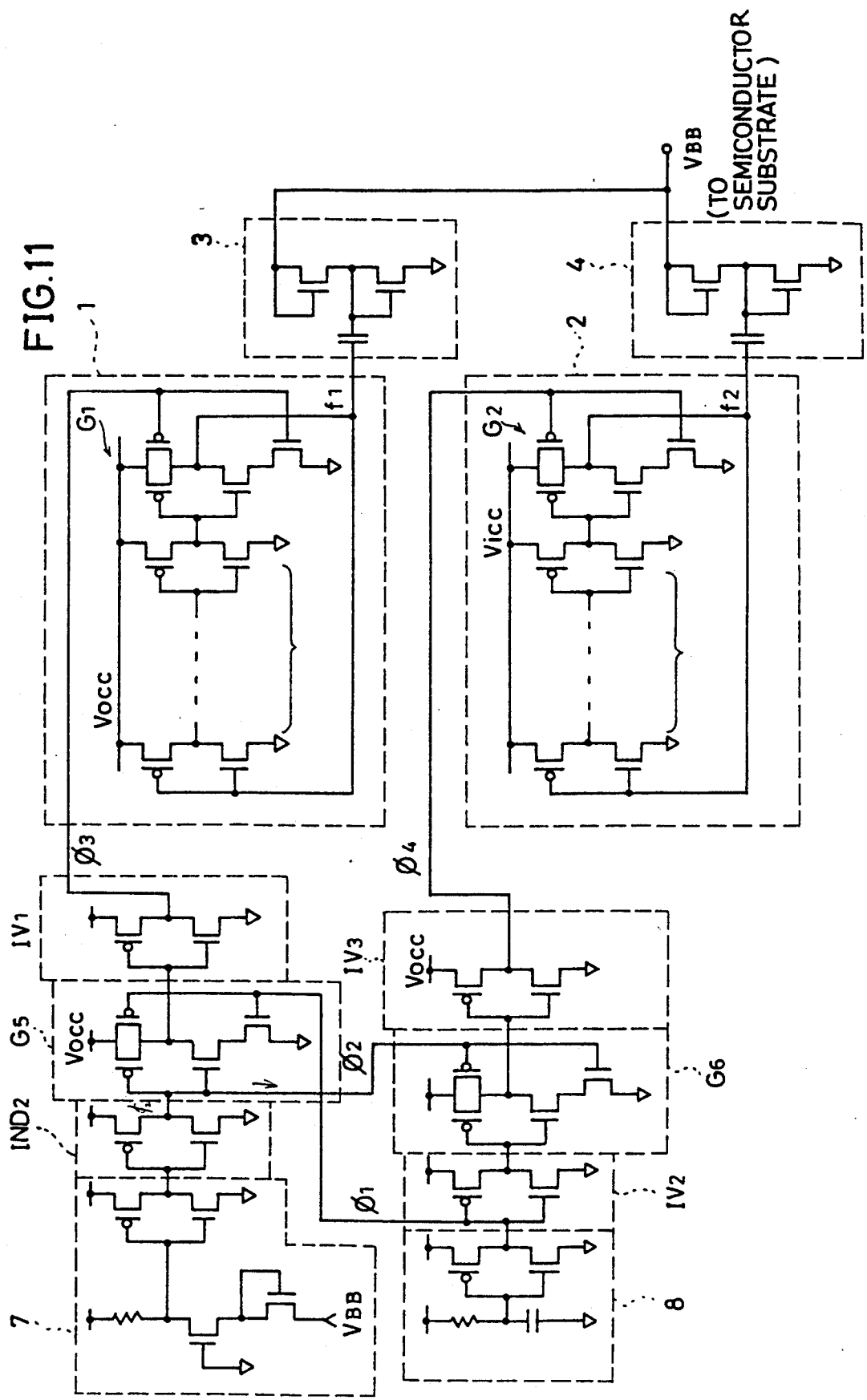
FIG. 11 is a diagram showing a construction of a substrate voltage generator according to a further embodiment of the present invention.

FIG. 11 is a diagram showing a construction of a substrate voltage generator according to a further embodiment of the present invention. The substrate voltage generator shown in FIG. 11 includes a substrate potential detecting circuit 7 and a power supply turn-on detecting circuit 8. One of substrate voltage generating circuits using the external power supply voltage Vocc and the internal power supply voltage Vicc as the operation power supply voltage is activated in response to detection signals from those circuits 7 and 8.

Referring to FIG. 11, the substrate voltage generator includes: a first ring oscillator 1 operating with the external power supply voltage Vocc as the operation power supply voltage; a second ring oscillator 2 operating with the internal power supply voltage Vicc as the operation power supply voltage; a first charge pump circuit 3 performing charge pump operation in response to an oscillation signal f1 from the first ring oscillator 1, thereby generating a first bias voltage and applying the same to the semiconductor substrate; a second charge pump circuit 4 performing charge pump operation in response to an oscillation signal f2 from the second ring oscillator 2, thereby generating a second bias voltage and applying the same to the semiconductor substrate; the substrate potential detecting circuit 7 for detecting a substrate potential; and the power supply turn-on detecting circuit 8 for detecting turn-on of the external power supply. The construction of those respective circuits is the same as shown in FIGS. 6, 9 and 10, and corresponding circuits are denoted by identical reference numerals.

The substrate potential detecting circuit 7 shown in FIG. 11 is represented as having only an inverter of one stage, which is equivalent to the inverters IN30 to IN32 of the three stages of the circuit shown in FIG. 7.

The substrate voltage generator further includes: an inverter IND2 receiving an output of the substrate potential detecting circuit 7; a gate circuit G5 receiving a detection signal $\phi1$ from the power supply turn-on detecting circuit 8 and an output of the inverter IND2; an inverter IV1 receiving an output of the gate circuit G5; an inverter IV2 receiving the detection signal $\phi1$ from the power supply turn-on detecting circuit 8; a gate circuit G6 receiving the output of the inverter IV2 and the output of the inverter IND2; and an inverter IV3 receiving an output of the gate circuit G6. The inverter IND2 inverts the detection signal from the substrate potential detecting circuit 7 and provides a control signal $\phi2$. The gate circuit G5 is activated in response to the detection signal $\phi1$ and functions as an inverter to invert the control signal $\phi2$ and to provide the output of the inversion. The inverter IV1 inverts the output of the gate circuit G5 and generates a control signal $\phi3$ controlling the oscillating operation of the first ring oscillator 1. The control signal $\phi3$ controls activation and inactivation of the first substrate voltage generating circuit (formed by the first ring oscillator 1 and the first charge pump circuit 3).

The inverter IV2 inverts the detection signal $\phi1$ and provides the output of the inversion. The gate circuit G6 is activated in response to the control signal $\phi2$ and functions as an inverter to invert the output of the inverter IV2. The inverter IV3 inverts the output of the gate circuit G6 and provides a control signal $\phi4$ controlling the oscillating operation of the second ring oscillator 2. The control signal $\phi4$ controls activation-/inactivation of the second substrate voltage generating circuit (formed by the second ring oscillator 2 and the second charge pump circuit 4). Now, operation of the substrate voltage generating circuits will be described.

(i) In the case of the control signal $\phi1$ at H level and the control signal $\phi2$ at H level This state is brought about immediately after turn-on of the supply of the external power supply voltage Vocc. The internal power supply voltage Vicc is not stable and the substrate potential $V_{BB}$ is shallower than the prescribed bias value. At this time, the gate circuit G5 functions as an inverter and provides a signal of L level. The control signal $\phi3$ from the inverter V1 attains H level so that the first ring oscillator 1 performs oscillating operation. The first charge pump circuit 3 performs charge pump operation in response to the oscillation signal f1, thereby lowering the substrate potential $V_{BB}$.

The gate circuit G6 functions as an inverter and provides a signal of H level. The control signal $\phi4$ from the inverter IV3 attains L level, whereby oscillating operation of the second ring oscillator 2 is forbidden and the signal $\phi2$ fixed to H level is provided. Consequently, charge pump operation of the second charge pump circuit 4 is forbidden.

(ii) In the case of the control signal $\phi1$ at H level and the control signal $\phi2$ at L level This state is a state in which after turn-on of the supply of the external power supply voltage Vocc the internal power supply voltage Vicc is not stable and the substrate potential $V_{BB}$ is deeper than the prescribed bias.

In this case, the gate circuit G5 functions as an inverter and provides a signal of H level. The control signal $\phi3$ from the inverter IV1 attains L level, whereby the oscillating operation of the first ring oscillator 1 is stopped and the signal f1 fixed at H level is generated. Thus, the charge pump operation of the first charge pump circuit 4 is forbidden.

The gate circuit G6 provides a signal of H level irrespective of the output of the inverter IV2. The control signal $\phi4$ from the inverter IV3 attains L level. In consequence, the signal f2 from the second ring oscillator 2 attains H level, whereby the charge pump operation of the second charge pump circuit 4 is forbidden.

(iii) In the case of the control signal $\phi1$ at L level and the control signal $\phi2$ at H level This state is a state in which the internal power supply voltage Vicc is stable and the substrate potential $V_{BB}$ is shallower than the prescribed bias value.

The output of the gate circuit G5 attains H level irrespective of the output level of the inverter IND2 and the control signal $\phi3$ attains L level. In consequence, the signal f1 from the first ring oscillator 1 is fixed to H level and the charge pump operation of the first charge pump circuit 1 is forbidden.

The gate circuit G6 functions as an inverter and provides a signal of L level in response to the control signal f1 of L level. The inverter IV3 provides a control signal $\phi4$ of H level. In consequence, the second ring oscillator 2 oscillates and provides the oscillation signal f2. The second charge pump circuit 4 performs charge pump operation in response to the oscillation signal f2 and lowers the substrate potential $V_{BB}$.

(iv) In the case of the control signal $\phi1$ at L level and the control signal $\phi2$ at L level This state is a state in which the internal power supply voltage Vicc is stable and the substrate potential $V_{BB}$ is deeper than the prescribed bias value.

The gate circuit G5 provides a signal of H level in response to the control signal $\phi1$ of L level. Consequently, the inverter IV1 provides the control signal $\phi3$ of L level. The first ring oscillator 1 is forbidden to perform oscillating operation, in response to this control signal $\phi3$ of L level and provides the signal f1 fixed to H level. The first charge pump circuit 3 is forbidden to perform charge pump operation by the signal f1 fixed to H level.

The gate circuit G6 provides a signal of H level in response to the control signal $\phi2$ of L level. The inverter INV3 provides the control signal $\phi4$ of L level. The second ring oscillator 2 is forbidden to perform the oscillating operation, in response to the control signal $\phi4$ of L level and provides the signal f2 of H level. The second charge pump circuit 4 is forbidden to perform the charge pump operation, in response to the signal f2 fixed to H level.

Figure 12:
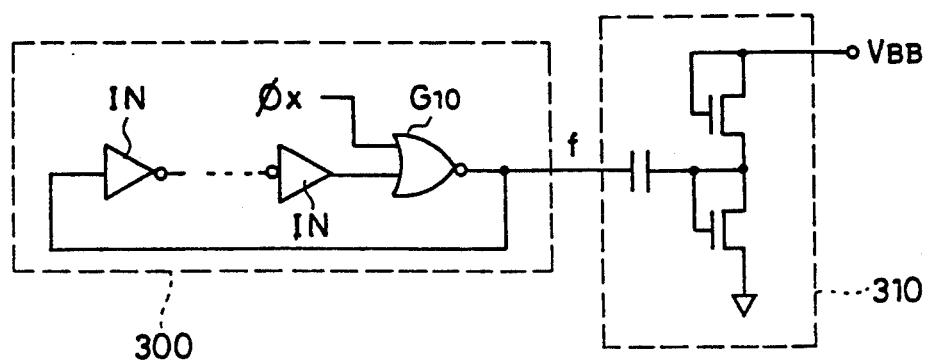
FIG. 12 is a diagram showing a construction of a substrate voltage generator according to a still further embodiment of the present invention.

FIG. 12 is a diagram showing a construction of a substrate voltage generator according to a further embodiment of the invention. Referring to FIG. 12, a ring oscillator 300 includes an even number of cascade-connected inverters IN, and a gate circuit G10 receiving an output from the inverter IN of the final stage as well as a regulation signal $\phi_x$. An output of the gate circuit G10 is connected to an input of the inverter IN of the first stage. The charge pump circuit 310 performs charge pump operation in response to the output of the gate circuit G10. The regulation signal $\phi_x$ is the same as the feedback signal shown in FIGS. 2 and 3.

As can be seen from FIG. 3, when the regulation signal $\phi x$ is at L level, current flows from the external power supply voltage Vocc to the internal power supply voltage applying line Vicc through the transistor P15, whereby lowering of the internal power supply voltage Vicc is prevented. This state is a state in which an internal circuit of the semiconductor device is operating and current from the internal power supply voltage Vicc is being consumed. In this state, the substrate potential $V_{BB}$ is liable to be shallow (due to the substrate current or the like) and, therefore, by increasing the driving capability of the substrate voltage generating circuit in this period and decreasing the driving capability of this substrate voltage generating circuit in other period, it is possible to reduce consumption of power while stably supplying the substrate voltage.

Referring to FIG. 12, the gate circuit G10 functions as an inverter when the regulation signal $\phi_x$ is at L level, and the ring oscillator 300 provides the oscillation signal f. When the regulation signal $\phi_x$ is at H level, the output of the gate circuit G10 is fixed to L level. Thus, when the regulation signal $\phi_x$ is at H level, the charge pump operation of the charge pump circuit 310 is forbidden, and when the regulation signal $\phi_x$ is at L level, the charge pump operation is performed.

Figure 5A:
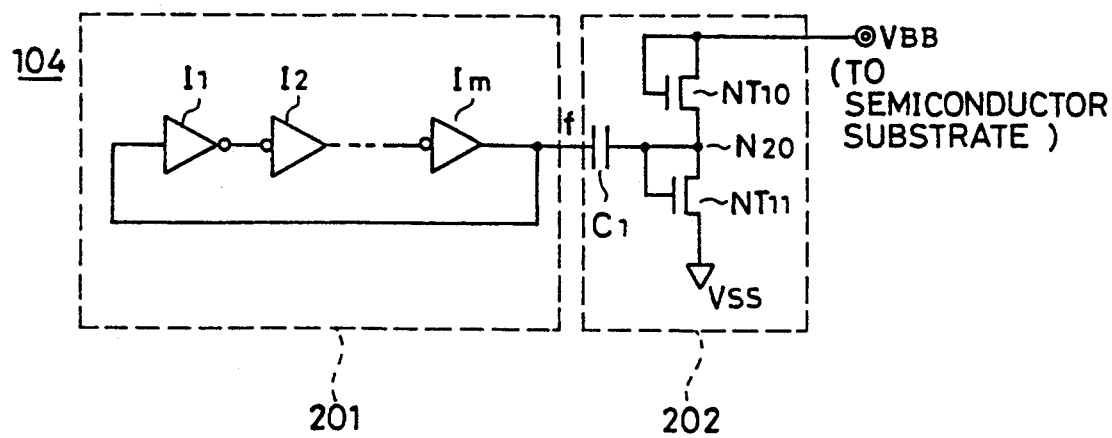
FIG. 5A is a diagram showing an example of a construction of a conventional substrate voltage generator.
Figure 5B:
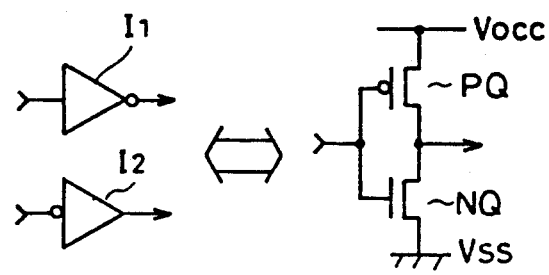
FIG. 5B is a diagram showing a specific construction of the inverter shown in FIG. 5A.

In the construction shown in FIG. 12, the regulation signal $\phi x$ is at L level until the internal power supply voltage Vicc becomes stable after the turn-on of the supply of the external power supply voltage and, accordingly, if the inverter IN included in the ring oscillator 300 operates using the external power supply voltage Vocc as the operation power supply voltage as shown in FIG. 5B, the substrate voltage can be prevented from rising at the time of turn-on of the power supply.

Figure 13:
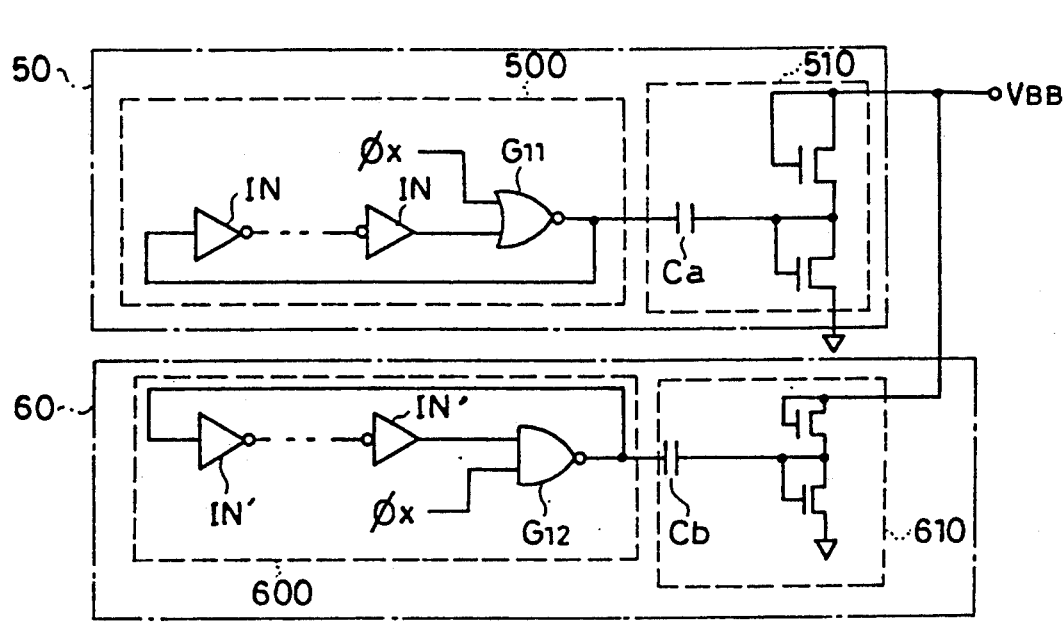
FIG. 13 is a diagram showing a construction of a substrate voltage generator according to a still further embodiment of the present invention.

FIG. 13 is a diagram showing a construction of a substrate voltage generation according to a further embodiment of the present invention. The substrate voltage generation shown in FIG. 13 includes a first substrate voltage generating circuit 50 having a larger driving capability and a second substrate voltage generating circuit 60 having a smaller driving capability. Both generating circuits operate using the external power supply voltage Vocc as the operation power supply voltage. The first substrate voltage generating circuit 50 includes a ring oscillator 500, and a charge pump circuit 510 performing charge pump operation in response to an output of the ring oscillator 500. The ring oscillator 500 includes an even number of cascade-connected inverters IN, and a NOR circuit G11 receiving an output of the inverter IN of the final stage as well as the regulation signal $\phi_x$. An output of the NOR circuit G11 is connected to the inverter IN of the first stage.

The second substrate voltage generating circuit 60 includes a ring oscillator 600, and a charge pump circuit 610 performing charge pump operation in response to an output of the ring oscillator 600. The ring oscillator 600 includes an even number of cascade-connected inverters IN', and a NAND circuit G12 receiving an output of the inverter IN, of the final stage as well as the regulation signal $\phi_x$. An output of the NAND circuit G12 is connected to an input of the inverter IN' of the first stage.

The first and second substrate voltage generating circuits 50 and 60 have different driving capabilities which are obtained by adjustment of the oscillation frequencies and the capacitance values of the capacitors Ca and Cb included in the charge pump circuits. In this case, the oscillation frequency of the ring oscillator 500 is higher than the oscillation frequency of the ring oscillator 600, or the capacitance value of the capacitor Ca of the charge pump circuit 510 is larger than the capacitance value of the capacitor Cb of the charge pump circuit 610, or those two conditions are satisfied.

When the regulation signal $\phi_x$ is at H level, the ring oscillator 500 provides a signal of L level and thus the charge pump operation of the charge pump circuit 510 is forbidden. In the substrate voltage generating circuit 610, since the NAND circuit G12 functions as an inverter, the ring oscillator 610 performs oscillating operation and the charge pump circuit 610 performs charge pump operation.

When the regulation signal $\phi_x$ is at L level, the inverter of the NOR circuit G11 functions as an inverter, while the NAND circuit G12 provides a signal fixed to H level. In consequence, the substrate voltage generating circuit 50 having the larger driving capability is activated, whereby the substrate potential $V_{BB}$ is rapidly lowered to the prescribed bias.

In this case, the operation power supply voltage of the first substrate voltage generating circuit 50 may be the external power supply voltage Vocc and the operation power supply voltage of the second substrate voltage generating circuit 60 may be the internal power supply voltage Vicc.

In the constructions shown in FIGS. 12 and 13, an output of the substrate potential detecting circuit may be used as a control signal, and if the substrate potential $V_{BB}$ is shallower than the prescribed bias value, the substrate voltage generating circuit is operated and if the substrate potential $V_{BB}$ is deeper than the prescribed bias value, the operation of the substrate voltage generating circuit is forbidden. In the case of the substrate voltage generator including two substrate voltage generating circuits having the different driving capabilities as shown in FIG. 13, if the substrate bias becomes deep, the operation of both of the generating circuits 50 and 60 may be stopped or only the substrate voltage generating circuit having the smaller driving capability may be driven. If the substrate bias is shallow, both of the substrate voltage generating circuits 50 and 60 may be operated simultaneously.

Figure 14:
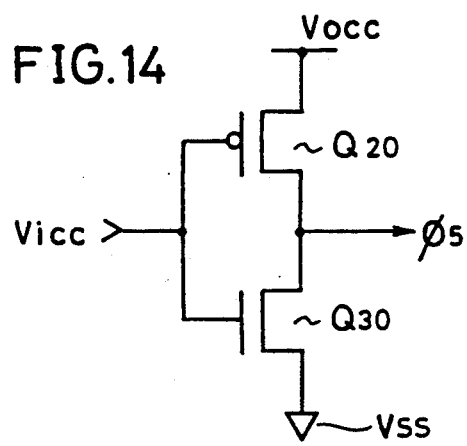
FIG. 14 is a diagram showing an example of a circuit construction for generating a control signal for switching operation of a substrate voltage generator according to a level of an internal power supply voltage.

Although the regulation signal $\phi_x$ is used as the control signal in the above-described construction, the operation of the substrate voltage generating circuits may be controlled in response to detection of the level of the internal power supply voltage Vicc as shown in FIG. 14.

FIG. 14 is a diagram showing a circuit construction for generating a signal for controlling the operation of the substrate voltage generating circuits according to the level of the internal power supply voltage Vicc. Referring to FIG. 14, the control signal generating circuit includes a p channel MOS transistor Q20 and an n channel MOS transistor Q30 complementarily connected between the external power supply voltage Vocc and the ground potential Vss. The internal power supply voltage Vicc is applied to the gates of the transistors Q20 and Q30. By regulating the threshold voltage or the on resistance of those transistors Q20 and Q30, it is possible to set the input logical threshold value of this control signal generating circuit to a suitable value. Consequently, in the circuit construction shown in FIG. 14, if the internal power supply voltage Vicc is lower than the input logical threshold value of the control signal generating circuit, a control signal $\phi 5$ of H level is generated and conversely if the internal power supply voltage Vicc is higher than the input logical threshold value, a control signal $\phi 5$ of L level is provided. If an inversion signal of the control signal $\phi 5$ is used in place of the regulation signal $\phi_x$ of the substrate voltage generating circuits shown in FIGS. 12 and 13, the operation of the substrate voltage generating circuits can be controlled according to the level of the internal power supply voltage Vicc and thus it is possible not only to prevent rise of the substrate potential at the time of turn-on of the supply of the external power supply voltage Vocc but also to attain low consumption of power.

The control signal $\phi 5$ can be also used in place of the control signal $\phi 1$ from the power supply turn-on detecting circuit 8 (as shown in FIG. 7) if the input logical threshold value is set to a prescribed rated value of the internal power supply voltage Vicc (i.e., a value in a stable state).

Figure 15:
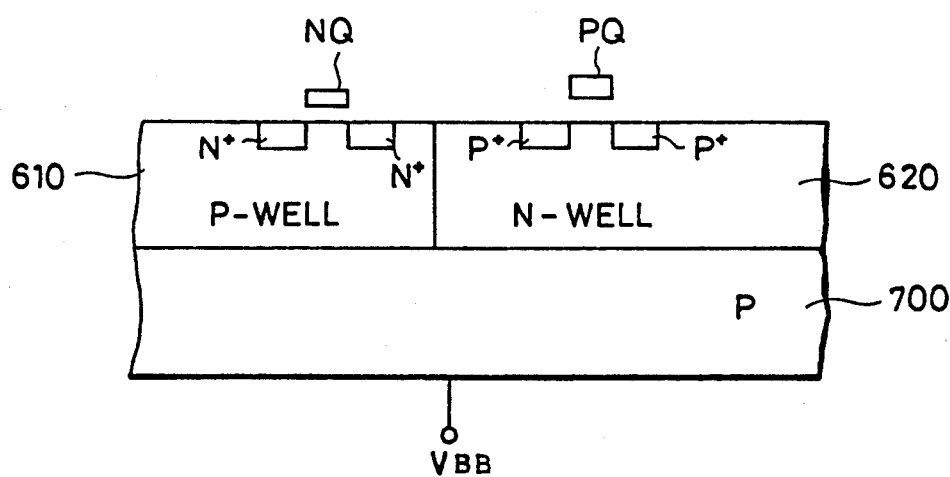
FIG. 15 is a view showing a schematic sectional structure of a semiconductor device to which the present invention is applied.

In any of the above-described embodiments, a negative potential bias is applied to the p type semiconductor substrate 700 where CMOS transistors are formed, as shown in FIG. 15. Referring to FIG. 15, the n channel MOS transistor NQ is formed in a p type well 610 and the p channel MOS transistor PQ is formed in an n type well 620. Both the p type well 610 and the n type well 620 are formed on the p type semiconductor substrate 700, to which the substrate bias potential $V_{BB}$ is applied. In such a structure in which well regions are formed on the p type semiconductor substrate and the p channel MOS transistor and the n channel MOS transistor are formed individually in the respective well regions, an n type semiconductor substrate may be used in place of the p type semiconductor substrate. If such an n type semiconductor substrate is used, well regions may be provided separately according to the operation power supply voltage Vcc and different substrate bias potentials may be applied to the respective well regions.

Figure 16:
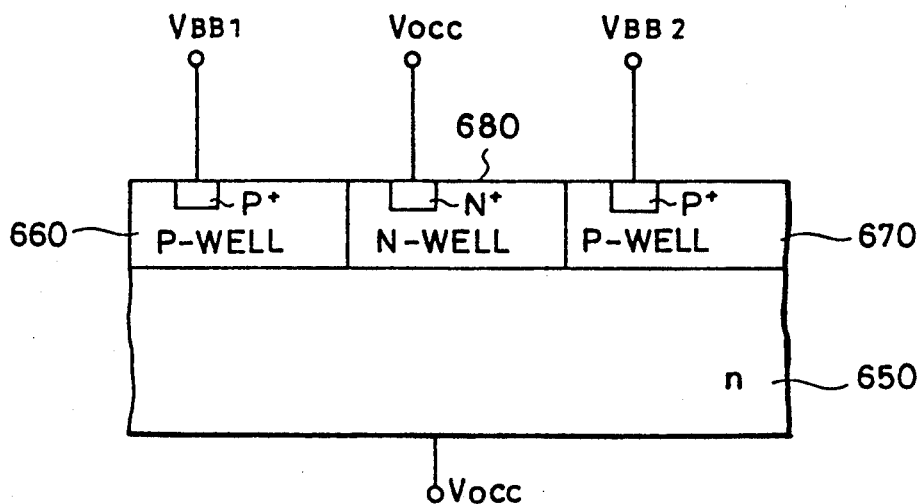
FIG. 16 is a view showing a schematic sectional structure of a semiconductor device to which a semiconductor substrate generator according to a still further embodiment of the invention is applied.

FIG. 16 is a view showing a relation of the well regions and the substrate bias potentials applied thereto in the case of using such an n type semiconductor substrate. Referring to FIG. 16, the first p type well 660 and the second p type well 670 are formed on the n type semiconductor substrate 650, and an n type well 680 is formed between the p type wells 660 and 670. The first semiconductor bias potential $V\phi 2$ is applied to the first p type well 660, and the second substrate bias potential $V_{BB}2$ is applied to the second p type well 670. The external power supply voltage Vocc is supplied to both the n type semiconductor substrate 650 and the n type well 680. In such a well structure, a circuit component using the external power supply voltage Vocc as the operation power supply voltage is formed in the first p type well 660 and a circuit component using the internal power supply voltage Vicc as the operation power supply voltage is formed in the second p type well 670. The substrate bias voltages $V_{BB}1$ and $V_{BB}2$ are set according to the respective operation power supply voltages. In this case, the method of constructing the substrate voltage generating circuits is as follows.

(a) The prescribed substrate bias voltages are applied to the first and second p type wells 660 and 670, respectively, by using only the substrate voltage generating circuit operating with the external power supply voltage as the operation power supply voltage for the first p type well 660, and using only the substrate voltage generating circuit operating with the internal power supply voltage Vicc as the operation power supply voltage for the second p type well 670. Each substrate voltage generating circuit may be provided with a circuit for controlling the operation thereof in response to an output of the substrate potential detecting circuit. In this case, substrate voltage generating circuits having different driving capabilities may be provided so that either of them can operate in response to the substrate potential.

(b) Substrate voltage generating circuits operating with the external power supply voltage Vocc and the internal power supply voltage Vicc are provided in the first and second p type wells 660 and 670. In this case, the manners of generating the control signals are made different respectively for the first and second p type wells 660 and 670, whereby the respective substrate potentials are set to values corresponding to the operation power supply voltages. If the threshold voltage of the n type MOS transistor of the substrate voltage generating circuit operating with the internal power supply voltage as the operation power supply voltage in the first p type well 660 is set small, the bias potential attained by the substrate voltage generating circuit operating with the internal power supply voltage Vicc can be set to a value corresponding to the external power supply voltage Vocc. Similarly, in the substrate voltage generating circuit in the second p type well 670, operating with the external power supply voltage Vocc as the operation power supply voltage, if the threshold voltage of the n channel MOS transistor of this circuit is set large, the bias potential attained by the substrate voltage generating circuit operating with the external power supply voltage Vocc as the operation power supply voltage can be set to a value corresponding to the internal power supply voltage Vicc. In this case, the manners described with reference to FIGS. 6 to 14 can be used as the manners of controlling the control signals.

In addition, it is also possible to apply the optimum substrate bias potential by suitably adapting only the control signal generating method without regulating the threshold voltages of the n channel MOS transistors included in such a charge pump circuit. Various combinations of the manners of operating the substrate voltage generating circuits described above with reference to FIGS. 6 to 14 may be used for applying the control signals in this case.

The above-described semiconductor device using the n type semiconductor substrate also makes it possible to apply the optimum substrate bias voltage to the p type well region, and in the same manner as in the case of the p type semiconductor substrate, it is possible to obtain the same effects such as prevention of injection of electrons, reduction of soft errors, prevention of the latch-up phenomenon etc.

In addition, in the above-described embodiments, the description has been made of the case of providing the substrate voltage generating circuit operating with the external power supply voltage Vocc and the substrate voltage generating circuit operating with the internal power supply voltage Vcc, and the case of using the substrate voltage generating circuits having different driving capabilities. In those cases, the oscillation frequencies of the ring oscillators in the respective substrate voltage generating circuits are maintained constant. However, it is also possible to change the oscillation frequencies of the ring oscillators by using the control signals in those embodiments.

The change of the oscillation frequencies of the ring oscillators can be made by changing the number of connected stages of inverters constituting the respective ring oscillators. More specifically, in the case of a ring oscillator, the smaller the number of stages of inverters is, the larger the oscillation frequency is, and conversely the larger the number of stages of inverters is, the smaller the oscillation frequency is. Thus, a switching device is provided between the output of the inverter of the final stage and the output terminal, and a switching device connecting the output of an arbitrary intermediate stage inverter to the output terminal is provided, whereby those switching devices are operated in a complementary manner in response to the control signals so as to change the oscillation frequency.

In addition, in the case of using the substrate voltage generating circuits having different driving capabilities in the above-described embodiment, the driving capabilities of the substrate voltage generating circuits can be changed by the oscillation frequencies of the ring oscillators and, accordingly, even by using one of the substrate voltage generating circuits, the number of connected stages of inverters of the ring oscillator is changed by a control signal, whereby the driving capability can be changed.

As described above, according to the present invention, in the semiconductor device having circuitry using the external power supply voltage as the operation power supply voltage and circuitry using the internal stepped-down voltage as the operation power supply voltage, the substrate voltage is generated according to the state of application of the substrate potential or the internal stepped-down voltage and thus it is always possible to stably supply the substrate voltage according to the operation power supply voltage to the semiconductor substrate.

Thus, according to the present invention, the substrate voltage generating circuit using the external power supply voltage is operated in a period after turn-on of the supply of the external power supply voltage until the internal power supply voltage becomes stable, and the substrate voltage generating circuit using the internal power supply voltage as the operation power supply voltage is operated after the internal power supply voltage has been stable. Consequently, it is possible to obtain the substrate voltage generator having high reliability and low consumption of current which is capable of preventing rise of the substrate potential at the time of starting the application of the external power supply voltage and is capable of supplying the optimum substrate bias voltage corresponding to the operation power supply voltage.

In addition, the operation power supply voltage of the substrate voltage generator is changed according to the substrate potential level, and thus it is possible to obtain the substrate voltage generator capable of supplying stably the semiconductor bias voltage to the semiconductor substrate with a lower consumption of current.

In addition, since the operation power supply voltage of the substrate voltage generator is changed according to the potential level of the internal power supply voltage or the substrate voltage generating circuits having different driving capabilities are selectively operated, it is possible to obtain the semiconductor voltage generator capable of supplying stably the optimum substrate bias voltage to the semiconductor substrate with low consumption of power.

Furthermore, since the circuit elements operating with different operation power supply voltages are formed in different semiconductor regions (well regions) and the substrate voltage generating circuits are provided for the respective semiconductor regions so as to be controlled independently, it is possible to obtain the substrate voltage generator capable of supplying stably and with low consumption of current the optimum substrate bias voltage to each semiconductor region according to the operation power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate voltage generator in a semiconductor device having a voltage down converter for stepping down an externally applied power supply voltage to a prescribed voltage and generating an internal stepped-down power supply voltage, said semiconductor device being formed on a semiconductor substrate, said substrate voltage generator comprising:

first substrate voltage applying means operating with said externally applied power supply voltage as an operation power supply voltage for applying a first bias voltage to said semiconductor substrate;

second substrate voltage applying means operating with said internal stepped-down power supply voltage as an operation power supply voltage for applying a second bias voltage to said semiconductor substrate;

substrate potential detecting means for detecting a potential of said semiconductor substrate;

first selective activation means responsive to an output of said substrate potential detecting means for selectively activating said first and second substrate voltage applying means;

stable state detecting means for detecting whether said internal stepped-down voltage is in a stable state or not, and second selective activation means responsive to an output of said stable state detecting means for selectively activating said first and second substrate voltage applying means.

2. The generator in accordance with claim 1, wherein said stable state detecting means includes power supply voltage application detecting means for detecting application of said externally applied power supply voltage to said semiconductor device, and control signal generating means responsive to an output of said power supply voltage application detecting means for generating a control signal and applying the control signal to said second selective activation means.

3. The generator in accordance with claim 2, wherein said control signal generating means includes first control signal generating means responsive to an output from said power supply voltage application detecting means for generating a first control signal activating said first substrate voltage applying means in a prescribed period, and second control signal generating means responsive to the output from said power supply voltage application detecting means for generating a second control signal activating said second substrate voltage generating means after an elapse of said prescribed period.

4. The generator in accordance with claim 1, wherein said stable state detecting means includes thresholding means for thresholding said internal stepped-down voltage and applying the thresholded voltage to said second selective activation means.

5. The generator in accordance with claim 1, wherein said voltage down converter includes a reference voltage generating circuit responsive to said externally applied power supply voltage for generating a predetermined reference voltage, a comparator comparing said internal stepped-down voltage and said reference voltage and generating a regulation signal according to a result of the comparison, and an output circuit responsive to said regulation signal for converting said externally applied power supply voltage to said internal stepped-down voltage and outputting said internal stepped-down voltage, and said stable state detecting means includes said comparator, with said regulation signal being supplied to said second selective activation means as a selective activation control signal.

6. The generator in accordance with claim 1, wherein said first and second substrate voltage applying means include in common a ring oscillator including a plurality of cascade-connected inverters, and a charge pump circuit responsive to an output of said ring oscillator for generating a bias voltage by a charge pump function and applying the bias voltage to said semiconductor substrate, and said second selective activation means includes means responsive to an output of said stable state detecting means for selectively supplying either said externally applied power supply voltage or said internal stepped-down voltage to said ring oscillator as an operation power supply voltage.

7. The generator in accordance with claim 1, wherein said first and second selective activation means include first activation responsive to an output of said stable state detecting means and an output of said control signal generating means for activating said first substrate voltage applying means when said internal stepped-down voltage is unstable and a potential of said semiconductor substrate is shallower than a predetermined level, and second activation means responsive to the output of said stable said detecting means and the output of said substrate potential detecting means for activating said second substrate voltage applying means when said internal stepped-down voltage is stable and said potential of said semiconductor substrate is deeper than said predetermined level.

8. The generator in accordance with claim 1, wherein said first and second substrate voltage applying means include in common a ring oscillator including a plurality of cascade-connected inverters, and a charge pump circuit responsive to an output of said ring oscillator for generating a bias voltage by a charge pump function and applying the bias voltage to said semiconductor substrate, said first selective activation means includes means responsive to an output of said substrate potential detecting means for selectively supplying either said externally applied power supply voltage or said ring oscillator as an operation power supply voltage.

9. The generator in accordance with claim 1, further comprising means responsive to the potential of said semiconductor substrate for regulating a level of said internal stepped-down voltage for transmission to said second semiconductor voltage applying means.

* * * * *